(12) United States Patent
Seo et al.

(10) Patent No.: US 11,495,280 B2
(45) Date of Patent: Nov. 8, 2022

(54) SEMICONDUCTOR MEMORY DEVICES AND MEMORY SYSTEMS INCLUDING THE SAME

(71) Applicant: SAMSUNG ELECTRONICS CO., LTD., Suwon-si (KR)

(72) Inventors: Jeongseok Seo, Seoul (KR); Kwanghyun Kim, Seongnam-si (KR); Chikook Kim, Seoul (KR); Seungwoo Ryu, Seoul (KR); Doohee Hwang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/399,349

(22) Filed: Aug. 11, 2021

(65) Prior Publication Data

US 2022/0165321 A1 May 26, 2022

(30) Foreign Application Priority Data

Nov. 23, 2020 (KR) .................. 10-2020-0157389

(51) Int. Cl.
*G11C 11/40* (2006.01)
*G11C 11/4072* (2006.01)
*H01L 25/065* (2006.01)

(52) U.S. Cl.
CPC ...... *G11C 11/4072* (2013.01); *H01L 25/0657* (2013.01); *H01L 2225/06506* (2013.01); *H01L 2225/06568* (2013.01); *H01L 2225/06586* (2013.01)

(58) Field of Classification Search
USPC ........................................................ 365/149
See application file for complete search history.

(56) References Cited

U.S. PATENT DOCUMENTS

| 7,432,731 | B2 | 10/2008 | Bains et al. |
| 7,439,762 | B2 | 10/2008 | Lee |
| 7,528,626 | B2 | 5/2009 | Kim |
| 7,626,416 | B2 | 12/2009 | Kim |
| 7,710,143 | B2 | 5/2010 | Jeong et al. |

(Continued)

FOREIGN PATENT DOCUMENTS

| KR | 1839881 A | 5/2013 |
| KR | 20160061855 A | 6/2016 |

*Primary Examiner* — Tan T. Nguyen
(74) *Attorney, Agent, or Firm* — Volentine, Whitt & Francos, PLLC

(57) ABSTRACT

A semiconductor memory device includes an external resistor provided on a board and a plurality of memory dies mounted on the board, designated as a master die and slave dies. The memory dies are commonly connected to the external resistor. The master die performs a first impedance calibration operation during an initialization sequence of the semiconductor memory device and stores, in a first register set therein, first calibration data, a first voltage and a first temperature. Each of the slave dies, after the first impedance calibration operation is completed, performs a second impedance calibration operation during the initialization sequence and stores, in a second register set therein, second calibration data associated with the second impedance calibration operation and offset data corresponding to a difference between the first calibration data and the second calibration data.

20 Claims, 18 Drawing Sheets

(56) References Cited

U.S. PATENT DOCUMENTS

| | | |
|---|---|---|
| 9,077,332 B2 | 7/2015 | Ko |
| 9,317,052 B1 | 4/2016 | Hwang |
| 10,255,969 B2 | 4/2019 | Eom et al. |
| 11,196,418 B1 * | 12/2021 | Suryanarayana .... G11C 29/028 |
| 2020/0265878 A1 * | 8/2020 | Ahn ..................... G11C 7/1051 |

* cited by examiner

SEMICONDUCTOR MEMORY DEVICES AND MEMORY SYSTEMS INCLUDING THE SAME

CROSS-REFERENCE TO RELATED APPLICATION

This application claims priority under 35 U.S.C. § 119 to Korean Patent Application No. 10-2020-0157389, filed on Nov. 23, 2020 in the Korean Intellectual Property Office, the disclosure of which is incorporated by reference herein in its entirety.

TECHNICAL FIELD

Example embodiments described herein relate to memory devices, and more particularly, to semiconductor memory devices including multi-dies and memory systems including the same.

DISCUSSION OF RELATED ART

As the operating speed of semiconductor memory devices has increased, swing width of signals interfaced between a semiconductor memory device and a memory controller has generally decreased. However, as swing width has decreased, signals transferred between the semiconductor memory device and the memory controller may be more easily distorted by impedance mismatch caused by process, voltage, and temperature (PVT) variations. An impedance calibration operation for adjusting output impedance and/or a termination impedance of the semiconductor memory device may be employed at transmitting and/or receiving stages of the semiconductor memory device. The impedance calibration operation may be referred to as an input/output (I/O) offset cancellation operation or a ZQ calibration operation.

SUMMARY

According to some example embodiments, a semiconductor memory device includes an external resistor provided on a board and a plurality of memory dies mounted on the board. The memory dies are commonly connected to the external resistor, one of the memory dies is designated as a master die and rest of the memory dies except the master die are designated as a plurality of slave dies. The master die performs a first impedance calibration operation to determine a resistance of a first output driver and a first reference output high level (VOH) voltage of the first output driver in response to an impedance calibration command during an initialization sequence of the semiconductor memory device and stores, in a first register set therein, first calibration data, a first voltage and a first temperature associated with the first impedance calibration operation. Each of the slave dies, after the first impedance calibration operation is completed, performs a second impedance calibration operation to determine a resistance of a second output driver and a second reference VOH voltage of the second output driver in response to the impedance calibration command during the initialization sequence and stores, in a second register set therein, second calibration data associated with the second impedance calibration operation and offset data corresponding to a difference between the first calibration data and the second calibration data.

According to some example embodiments, a memory system includes a semiconductor memory device including a plurality of memory dies and a memory controller to control the semiconductor memory device. The semiconductor memory device includes an external resistor provided on a board and a plurality of memory dies mounted on the board. The memory dies are commonly connected to the external resistor, one of the memory dies is designated as a master die and rest of the memory dies except the master die are designated as a plurality of slave dies. The master die performs a first impedance calibration operation to determine a resistance of a first output driver and a first reference output high level (VOH) voltage of the first output driver in response to an impedance calibration command during an initialization sequence of the semiconductor memory device and stores, in a first register set therein, first calibration data, a first voltage and a first temperature associated with the first impedance calibration operation. Each of the slave dies, after the first impedance calibration operation is completed, performs a second impedance calibration operation to determine a resistance of a second output driver and a second reference VOH voltage of the second output driver in response to the impedance calibration command during the initialization sequence and stores, in a second register set therein, second calibration data associated with the second impedance calibration operation and offset data corresponding to a difference between the first calibration data and the second calibration data.

According to some example embodiments, a semiconductor memory device includes an external resistor provided on a board and a plurality of memory dies mounted on the board. The memory dies are commonly connected to the external resistor, one of the memory dies is designated as a master die and rest of the memory dies except the master die are designated as a plurality of slave dies. The master die performs a first impedance calibration operation to determine a resistance of a first output driver and a first reference output high level (VOH) voltage of the first output driver in response to an impedance calibration command during an initialization sequence of the semiconductor memory device and stores, in a first register set therein, first calibration data, a first voltage and a first temperature associated with the first impedance calibration operation. Each of the slave dies, after the first impedance calibration operation is completed, performs a second impedance calibration operation to determine a resistance of a second output driver and a second reference VOH voltage of the second output driver in response to the impedance calibration command during the initialization sequence, stores, in a second register set therein, second calibration data associated with the second impedance calibration operation and offset data corresponding to a difference between the first calibration data and the second calibration data, and updates the second calibration data stored in the second register set by a difference indicated by the offset data in response to a calibration trigger signal which is aperiodically provided from the master die based on a detection signal associated with an operating voltage and an operating temperature of the semiconductor memory device during an idle period of the semiconductor memory device.

Therefore, each of the slave dies stores the second calibration data and the offset data corresponding to the first calibration data and the second calibration data in each of the second register set during the initialization sequence. Each of the slave dies updates the second calibration data based on the offset data without performing extra impedance calibration operation. Therefore, each of the slave dies may reduce an interval corresponding to a background impedance calibration interval during the idle period.

BRIEF DESCRIPTION OF THE DRAWINGS

The above and other features of the disclosure will be more clearly understood by describing in detail example embodiments thereof with reference to the accompanying drawings.

DETAILED DESCRIPTION OF THE EMBODIMENTS

Figure 1:
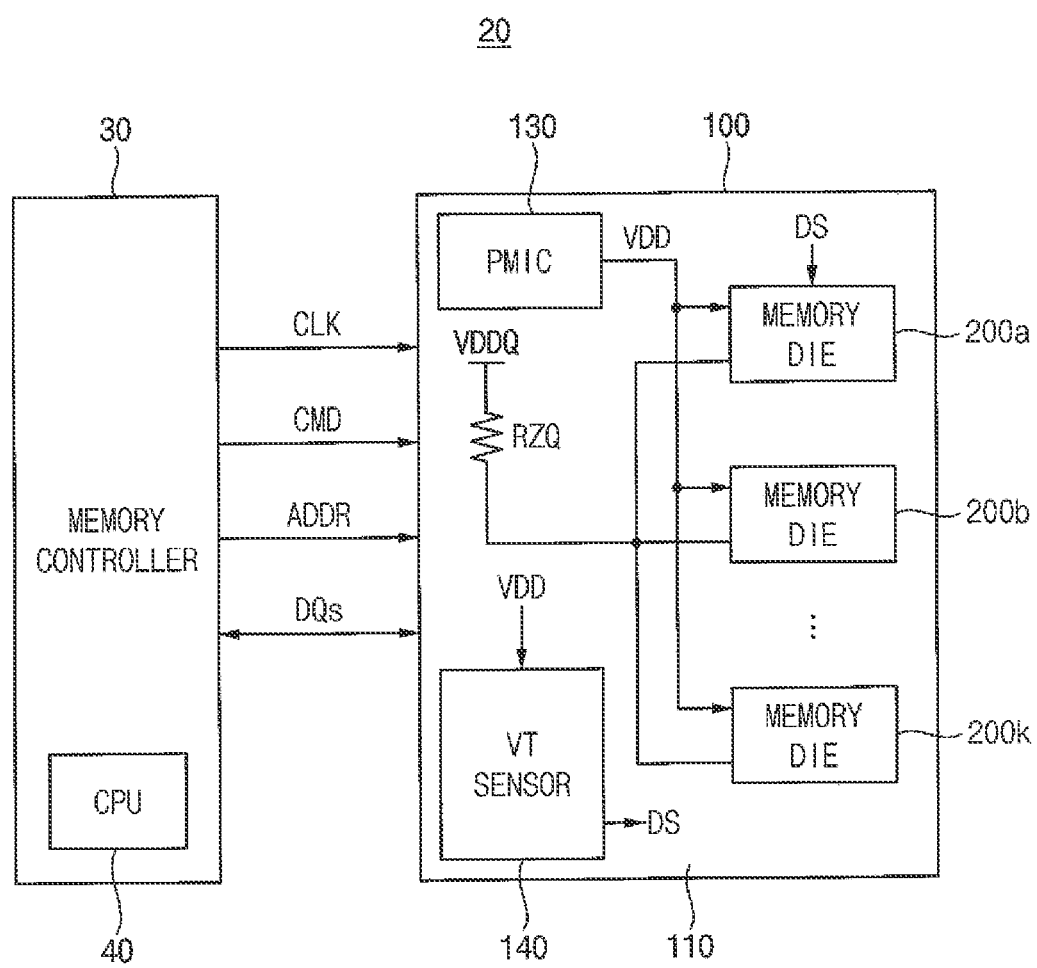
FIG. 1 is a block diagram illustrating a memory system according to example embodiments.

Example embodiments of the disclosure will be described more fully hereinafter with reference to the accompanying drawings. Like reference numerals may refer to like elements throughout this application.

FIG. 1 is a block diagram illustrating a memory system according to example embodiments.

Referring to FIG. 1, a memory system 20 may include a memory controller 30 and a semiconductor memory device 100. The semiconductor memory device 100 includes a plurality of memory dies 200a~200k, where k is an integer greater than two. In example embodiments, each of the memory dies 200a~200k may be referred to as a memory chip. One (for example, the memory die 200a) of memory dies 200a~200k may be indicated by a master die and the rest (for example, the memory dies 200b~200k) of the memory dies 200a~200k except the memory die 200a may be indicated as a plurality of slave dies.

The memory controller 30 may control an overall operation of the memory system 20. The memory controller 30 may control an overall data exchange between an external host and the plurality of memory dies 200a~200k. For example, the memory controller 30 may write data in the plurality of memory dies 200a~200k or read data from the plurality of memory dies 200a~200k in response to a request from the host. In addition, the memory controller 30 may issue operation commands to the plurality of memory dies 200a~200k for controlling the plurality of memory dies 200a~200k.

The memory controller 30 transmits, to the memory dies 200a~200k, control signals such as a clock signal CLK, a command CMD, an address ADDR, and data signals DQs. The memory controller 30 also receives the data signals DQs from the memory dies 200a~200k. Although not illustrated, the memory controller 30 may transmit data strobes signals along with the data signals DQs to the memory dies 200a~200k and may receive the data strobes signals along with the data signals DQs from the memory dies 200a~200k. The memory controller 30 may transmit a write command, a read command, and an impedance calibration command to each of the memory dies 200a~200k. Each of the memory dies 200a~200k may perform a write operation in response to the write command, a read operation in response to the read command, and an impedance calibration operation in response to the impedance calibration command.

In example embodiments, each of the plurality of memory dies 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), or the like.

The memory dies 200a~200k may be commonly connected to an external resistor RZQ provided (or, formed) in a board 110. The external resistor RZQ may be connected to a power supply voltage VDDQ. In an example embodiment, the external resistor RZQ may be connected to a ground voltage.

The semiconductor memory device 100 may further include a power management integrated circuit (PMIC) 130 and a voltage/temperature (VT) sensor 140.

The PMIC 130 may generate an operating voltage VDD based on an input voltage (not illustrated) from the memory controller 30 and may provide the operating voltage VDD to the memory dies 200a~200k. The voltage/temperature sensor 140 may sense a level of the operating voltage VDD and an operating temperature of the semiconductor memory device 100, and provide the master die 200a with a detection signal DS that is activated when a change of level of the operating voltage VDD and the operating temperature exceeds a reference range. The voltage/temperature sensor 140 may not activate the detection signal DS when the change of level of the operating voltage VDD and the operating temperature exceeds the reference range within a determined time interval for preventing the impedance calibration operation from being performed frequently, around the reference range, in an idle mode of the semiconductor memory device 100.

The memory controller 30 may include a central processing unit (CPU) 40 to control operation of the memory controller 30.

Each of the plurality of memory dies 200a~200k may perform an impedance calibration operation in response to a first impedance calibration command from the memory controller 30 during an initialization sequence in which power is applied to the semiconductor memory device 100.

The master die 200a may perform a first impedance calibration operation to determine a resistance of a first output driver and a first reference output high level (VOH) voltage of the first output driver in response to a first impedance calibration command during the initialization sequence, and may store in a first register set therein first calibration data, a first voltage, and a first temperature associated with the first impedance calibration operation.

Each of the slave dies 200b~200k, after the first impedance calibration operation is completed, may perform a second impedance calibration operation to determine a resistance of a second output driver and a second reference VOH voltage of the second output driver in response to the first impedance calibration command during the initialization sequence, and may store in a second register set therein second calibration data associated with the second impedance calibration operation and offset data corresponding to a difference between the first calibration data and the second calibration data.

In addition, the master die 200 may compare, aperiodically, the first voltage and the first temperature with a second voltage and a second temperature of the semiconductor memory device 100 based on the detection signal DS associated with an operating voltage and an operating temperature of the semiconductor memory device 100 during an idle period of the semiconductor memory device 100, may perform a background impedance calibration operation when a first difference between the second voltage and the first voltage and a second difference between the second temperature and the first temperature exceed a reference range, may store in the first register set third calibration data associated with the background impedance calibration operation, the second voltage and the second temperature, and may provide the slave dies 200b~200k with a calibration trigger signal associated with the background impedance calibration operation. The calibration trigger signal may indicate that the background impedance calibration operation is performed.

In addition, each of the slave dies 200b~200k, after the background impedance calibration operation is completed, may update the second calibration data stored in the second register set by a difference indicated by offset data in response to the calibration trigger signal during the idle period.

Figure 2:
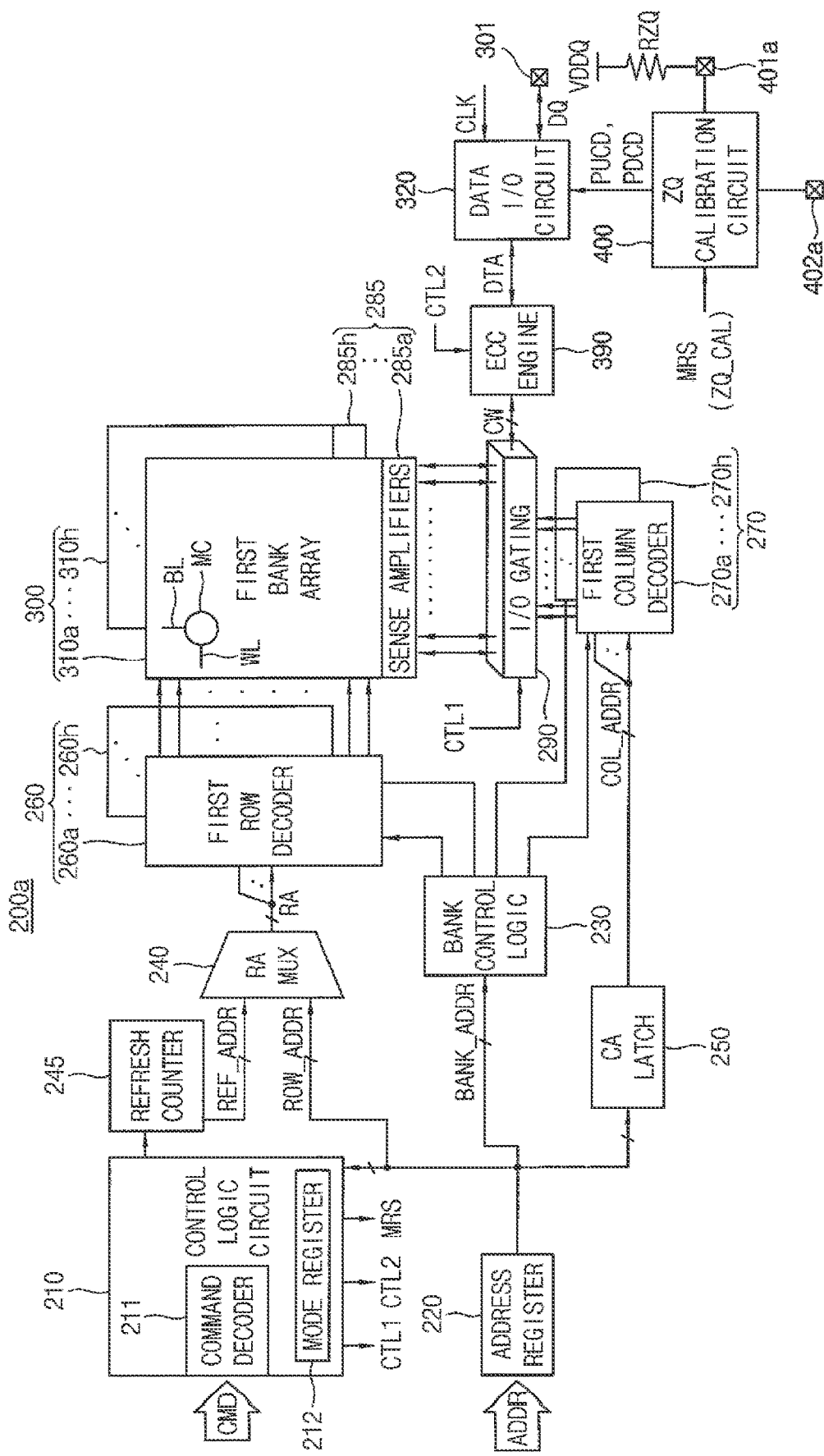
FIG. 2 is a block diagram illustrating an example of the master die in the semiconductor memory device in FIG. 1 according to example embodiments.

FIG. 2 is a block diagram illustrating an example of the master die in the semiconductor memory device in FIG. 1 according to example embodiments.

Referring to FIG. 2, the master die 200a may include a control logic circuit 210, an address register 220, a bank control logic 230, a row address multiplexer 240, a refresh counter 245, a column address latch 250, a row decoder 260, a column decoder 270, a sense amplifier unit 285, an I/O gating circuit 290, a memory cell array 300, a data I/O circuit 320, an error correction code (ECC) engine 390, and an impedance (ZQ) calibration circuit 400.

The memory cell array 300 may include first through eighth bank arrays 310a~310h, the row decoder 260 may include first through eighth bank row decoders 260a~260h respectively coupled to the first through eighth bank arrays 310a~310h, the column decoder 270 may include first through eighth bank column decoders 270a~270h respectively coupled to the first through eighth bank arrays 310a~310h, and the sense amplifier unit 285 may include first through eighth bank sense amplifiers 285a~285h respectively coupled to the first through eighth bank arrays 310a~310h.

The first through eighth bank arrays 310a~310h, the first through eighth bank row decoders 260a~260h, the first through eighth bank column decoders 270a~270h, and the first through eighth bank sense amplifiers 285a~285h may form first through eighth banks. Each of the first through eighth bank arrays 310a~310h may include a plurality of memory cells MC, formed at intersections of a plurality of word-lines WL and a plurality of bit-line BL.

The address register 220 may receive the address ADDR including a bank address BANK_ADDR, a row address ROW_ADDR, and a column address COL_ADDR from the memory controller 30. The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220 and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The refresh counter 245 may sequentially increase or decrease the refresh row address REF_ADDR under control of the control logic circuit 210.

The activated one of the first through eighth bank row decoders 260a~260h (activated by the bank control logic 230) may decode the row address RA that is output from the row address multiplexer 240, and activate a word-line corresponding to the row address RA. For example, the activated bank row decoder may apply a word-line driving voltage to the word-line corresponding to the row address.

The column address latch 250 may receive the column address COL_ADDR from the address register 220 and temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may activate a sense amplifier corresponding to the bank address BANK_ADDR and the column address COL_ADDR through the I/O gating circuit 290.

The I/O gating circuit 290 may include circuitry for gating input/output data and may further include input data mask logic, read data latches for storing data that is output from the first through eighth bank arrays 310a~310h, and write drivers for writing data to the first through eighth bank arrays 310a~310h.

A codeword CW that is read from one bank array of the first through eighth bank arrays 310a~310h may be sensed by a sense amplifier coupled to the one bank array from which the data is to be read and may be stored in the read data latches. The codeword CW stored in the read data latches may be provided to the memory controller 30 via the data I/O circuit 320 after ECC decoding is performed on the codeword CW by the ECC engine 390.

The data signal DQ to be written in one bank array of the first through eighth bank arrays 310a~310h may be provided to the data I/O circuit 320 from the memory controller 30. The data I/O circuit 320 may provide data DTA to the ECC engine 390 based on the data signal DQ. The ECC engine 390 may perform an ECC encoding on the data DTA to generate parity bits, the ECC engine 390 may provide the data DTA and the parity bits to the I/O gating circuit 290, and the I/O gating circuit 290 may write the data DTA and the parity bits in a sub-page in one bank array through the write drivers.

The data I/O circuit 320 may receive the clock signal CLK and the data signal DQ in a write operation. The data I/O circuit 320 may drive bits of the data DTA based on a pull-up control code PUCD and a pull-down control code PDCD from the impedance calibration circuit 400 to generate the data signal DQ having a target VOH level and provide the data signal DQ to the memory controller 30 through a data I/O pad 301 in a write operation.

The ECC engine 390 may perform an ECC encoding on the data DTA based on a second control signal CTL2 from the control logic circuit 210.

The impedance calibration circuit 400 may be connected to the external resistor RZQ through an impedance (ZQ) pad 401a, and the external resistor RZQ may be coupled to the power supply voltage VDDQ. In example embodiments, the external resistor RZQ may be coupled to the ground voltage. In addition, the impedance calibration circuit 400 may be connected to the slave devices 200b~200k through a connection pad 402a.

The control logic circuit 210 may control operations of the master die 200a. For example, the control logic circuit 210 may generate control signals for the master die 200a in order to perform a write operation, a read operation or an impedance calibration operation. The control logic circuit 210 may include a command decoder 211 that decodes the command CMD received from the memory controller 30 and may include a mode register 212 that sets an operation mode of the master die 200a.

The command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, may generate the second control signal CTL2 to control the ECC engine 390 and may generate a mode register set signal MRS to control the impedance calibration circuit 400. The mode register set signal MRS may include an impedance calibration command ZQ_CAL.

Configuration of each of the slave dies 200b~200k may be substantially the same as or similar with configuration of the master die 200a of FIG. 2.

Figure 3:
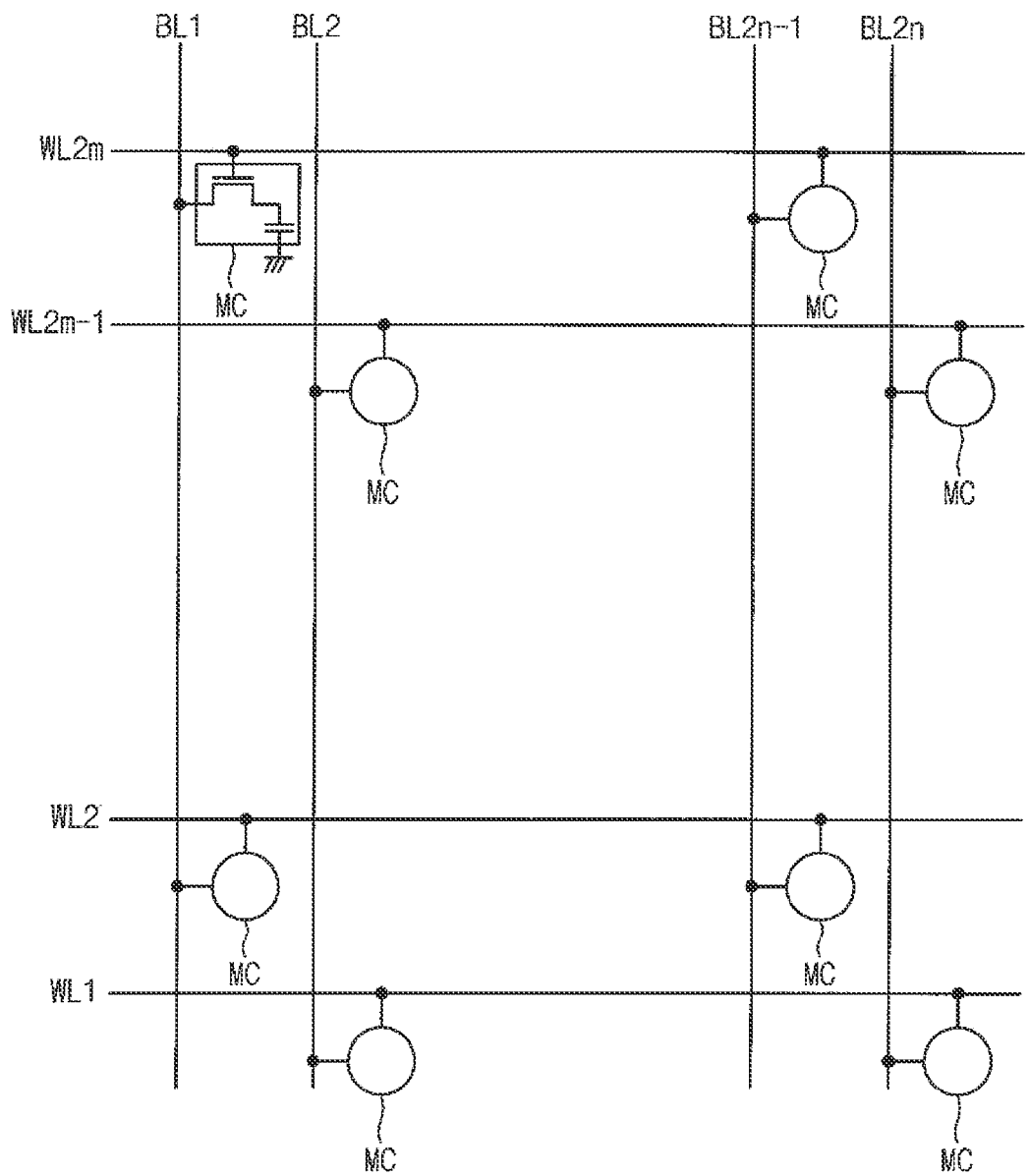
FIG. 3 illustrates a first bank array in the master die of FIG. 2 according to example embodiments.

FIG. 3 illustrates a first bank array in the master die of FIG. 2 according to example embodiments.

Referring to FIG. 3, the first bank array 310a may include a plurality of word-lines WL1, WL2, WL2m-1, and WL2m (e.g., WL1~WL2m) where m is a natural number greater than two, a plurality of bit-lines BL1, BL2, BL2n-1, and BL2n (e.g., BL1~BL2n) where n is a natural number greater than two, and a plurality of memory cells MC disposed near intersections between the word-lines WL1~WL2m and the bit-lines BL1~BL2n. In example embodiments, each of the plurality of memory cells MC may include a dynamic random access memory (DRAM) cell structure. The plurality of word-lines WL1~WL2m, to which the plurality of memory cells MC are connected, may be referred to as rows of the first bank array 310a and the plurality of bit-lines BL1~BL2n, to which the plurality of memory cells MC are connected, may be referred to as columns of the first bank array 310a.

Figure 4:
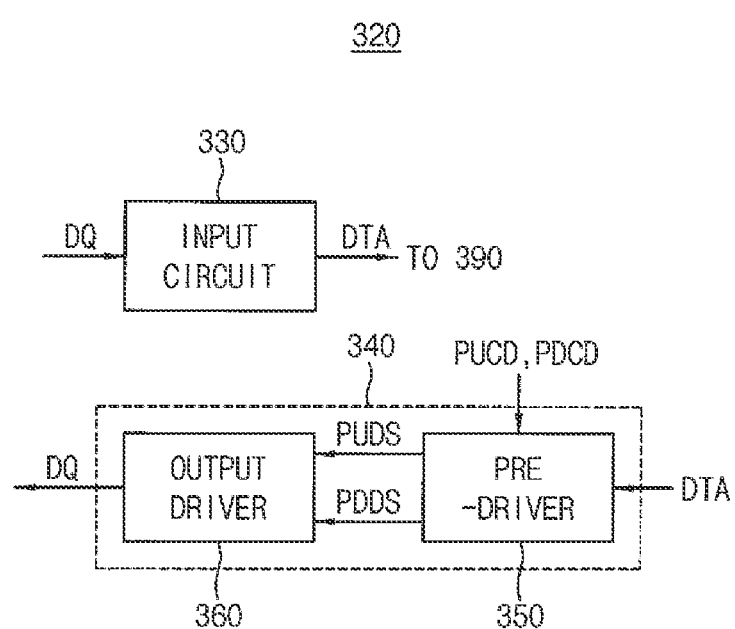
FIG. 4 illustrates a data I/O circuit in the master die of FIG. 2 according to example embodiments.

FIG. 4 illustrates a data I/O circuit in the master die of FIG. 2 according to example embodiments.

Referring to FIG. 4, the data I/O circuit 320 may include a data input circuit 330 and a data output circuit 340. The data output circuit 340 may include a pre-driver 350 and an output driver 360.

The data input circuit 330 may receive the data signal DQ from the memory controller 30, may convert the data signal DQ to the data DTA, and may provide the data DTA to the ECC engine 390. The data output circuit 340 may convert data DTA from the ECC engine 390 to the data signal DQ and provide the data signal DQ to the memory controller 30.

The pre-driver 350 may receive the data DTA, may generate a pull-up driving signal PUDS and a pull-down driving signal PDDS based on the pull-up control code PUCD and the pull-down control code PDCD, and may provide the pull-up driving signal PUDS and the pull-down driving signal PDDS to the output driver 360.

For example, when the data DTA is at a high level, the pre-driver 330 may buffer the pull-up control code PUCD and generate the pull-up driving signal PUDS to be substantially the same as the pull-up control code PUCD, and may generate the pull-down driving signal PDDS for turning off all transistors included in a pull-down driver (such as a pull-down driver 363 shown in FIG. 5) of the output driver 360. Contrarily, when the data DTA is at a low level, the pre-driver 330 may buffer the pull-down control code PDCD and generate the pull-down driving signal PDDS to be substantially the same as the pull-down control code PDCD, and generate the pull-up driving signal PUDS for turning off all transistors included in a pull-up driver (such as a pull-up driver 361 shown in FIG. 5) of the output driver 360. The pre-driver 350 may determine a current generated by the pull-up driver 361 and a resistance of the pull-down driver 363 (shown in FIG. 5) when the output driver 360 outputs the data signal DQ.

Figure 5:
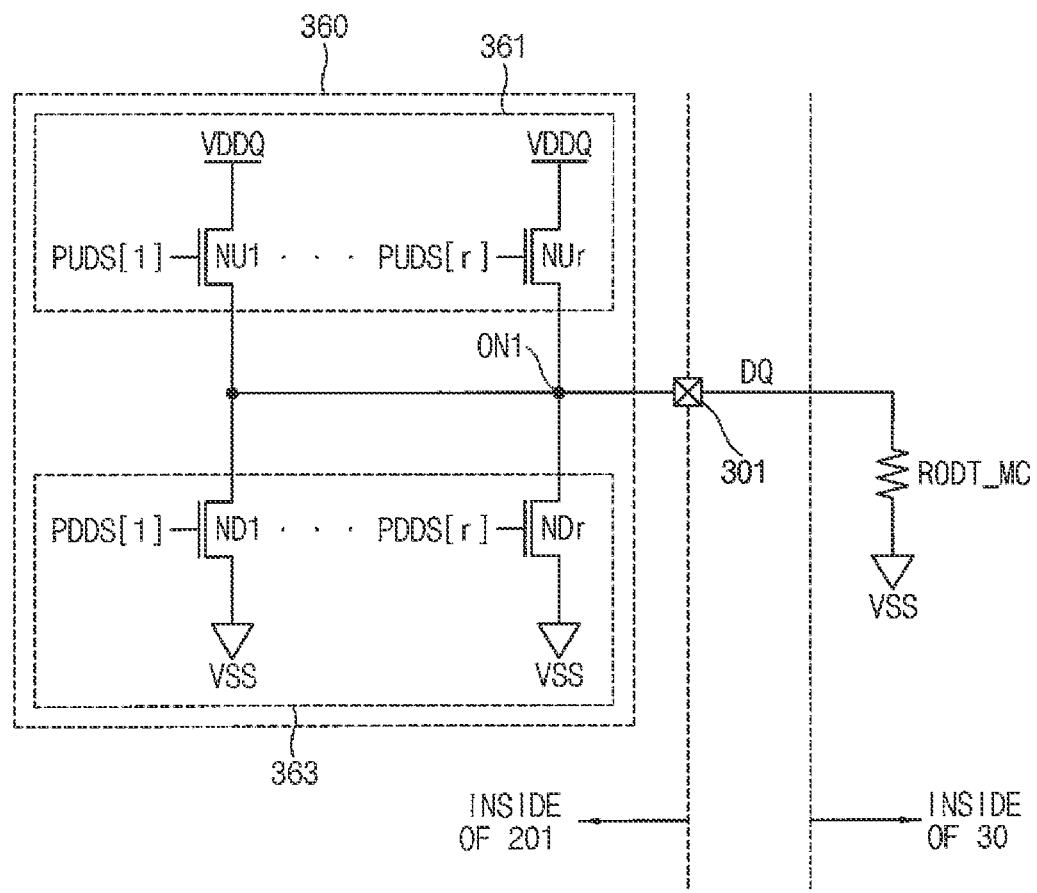
FIG. 5 illustrates a circuit diagram of an output driver in the data I/O circuit in FIG. 4 according to example embodiments.

FIG. 5 illustrates a circuit diagram of an output driver in the data I/O circuit in FIG. 4 according to example embodiments.

Referring to FIG. 5, the output driver 360 may include the pull-up driver 361 and the pull-down driver 363.

The pull-up driver 361 may include first through r-th (r is a natural number greater than one) pull-up transistors NU1 through NUr connected between the power supply voltage VDDQ and an output node ON1. Each of the first through r-th pull-up transistors NU1 through NUr may be an n-channel metal oxide semiconductor (NMOS) transistor.

The pull-down driver 363 may include first through r-th pull-down transistors ND1 through NDr connected between the output node ON1 and a ground voltage VSS. Each of the first through r-th pull-down transistors ND1 through NDr may be an NMOS transistor.

When the data DTA is at the high level, the pull-up driver 361 may receive the pull-up driving signal PUDS (e.g., PUDS[1] through PUDS[r]) corresponding to the pull-up control code PUCD from the pre-driver 350 and generate the current determined by the pull-up control code PUCD. The pull-down transistors ND1 through NDr included in the pull-down driver 363 may all be turned off according to the pull-down driving signal PDDS (e.g., PDDS[1] through PDDS [r]).

When the data DTA is at the high level, the current generated by the pull-up driver 361 may be transmitted to an on-die termination (ODT) resistor RODT_MC in the memory controller 30 via the data I/O (or DQ) pad 301. The data signal DQ that the ODT resistor RODT_MC receives is determined by the current generated by the pull-up driver 361 and the ODT resistor RODT_MC and has the target VOH voltage that has been adjusted according to the pull-up control code PUCD generated by the impedance calibration circuit 400.

When the data DTA is at the low level, the pull-up transistors NU1 through NUr included in the pull-up driver 361 may all be turned off according to the pull-up driving signal PUDS. The pull-down driver 363 may receive the pull-down driving signal PDDS corresponding to the pull-down control code PDCD from the pre-driver 330 and may have a resistance determined by the pull-down control code PDCD.

When the data DTA is at the low level, no current is generated by the pull-up driver 361, and therefore, the data signal DQ that the ODT resistor RODT_MC receives has an output low level voltage (VOL) voltage which is substantially the same as the ground voltage VSS.

According to example embodiments, the total resistance, e.g., a termination resistance (RTT), of the pull-up driver 361 or the pull-down driver 363 may be changed in response to a particular pull-up or pull-down driving signal PUDS or PDDS. Single loading or double loading can be implemented by changing the number of memory modules inserted into a memory slot and an RTT appropriate to conditions can be selected.

Figure 6:
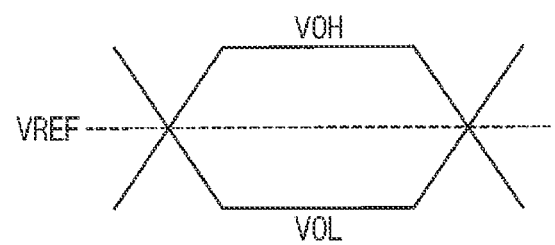
FIG. 6 illustrates a diagram for explaining the operation of a data output circuit in FIG. 5 according to example embodiments.

FIG. 6 illustrates a diagram for explaining the operation of a data output circuit in FIG. 5 according to example embodiments.

Referring to FIG. 6, the data signal DQ may have a high level or a low level according to the data DTA. The data signal DQ is an alternating current (AC) signal that swings between VOH and VOL.

The memory controller 30 may receive the data signal DQ from each of the memory dies 200a~200k, determine the VOH and VOL voltages, and determine a reference voltage VREF from the VOH and VOL voltages. The memory controller 30 may compare the data signal DQ with the reference voltage VREF and determine a received data value (e.g., 0 or 1).

Various process-voltage-temperature (PVT) conditions may be applied to each of the memory dies 200a~200k. The PVT conditions may include non-uniform doping in a wafer process, a voltage drop as current passes through different elements when power is supplied, and a temperature along a path through which a signal passes. AC on-resistance (hereinafter, referred to as "Ron AC") at the output side of the memory dies 200a~200k may vary with the PVT conditions, and the VOH voltage of the data signal DQ may vary with the Ron AC.

Various operating frequencies may be applied to each of the memory dies 200a~200k. When the operating frequency is changed, the VOH voltage of the data signal DQ may vary. Therefore, signal integrity of each of the memory dies 200a~200k may be enhanced by generating the pull-up control code PUCD and the pull-down control code PDCD according to the PVT conditions (e.g., operating parameters) and the operating frequency, such that the data signal DQ has an optimum VOH voltage.

The impedance calibration circuit 400 may generate the pull-up control code PUCD and the pull-down control codes PDCD for the target VOH voltage and store the pull-up control code PUCD and the pull-down control code PDCD in a first register set therein, in response to the mode register set signal MRS during the impedance calibration interval.

During a normal operation period, the impedance calibration circuit 400 may provide the data output circuit 360 with the pull-up control code PUCD and the pull-down control code PDCD for the target VOH voltage and the data output circuit 360 may transmit the data signal DQ to the memory controller 30 based on the pull-up control code PUCD and the pull-down control code PDCD. The mode register set signal MRS may include information about the impedance of the ODT resistor RODT_MC of the memory controller 30 and may include information indicating whether to increase or decrease the VOH voltage of the data signal DQ. The mode register set signal MRS may include the impedance calibration command ZQ_CAL.

Figure 7:
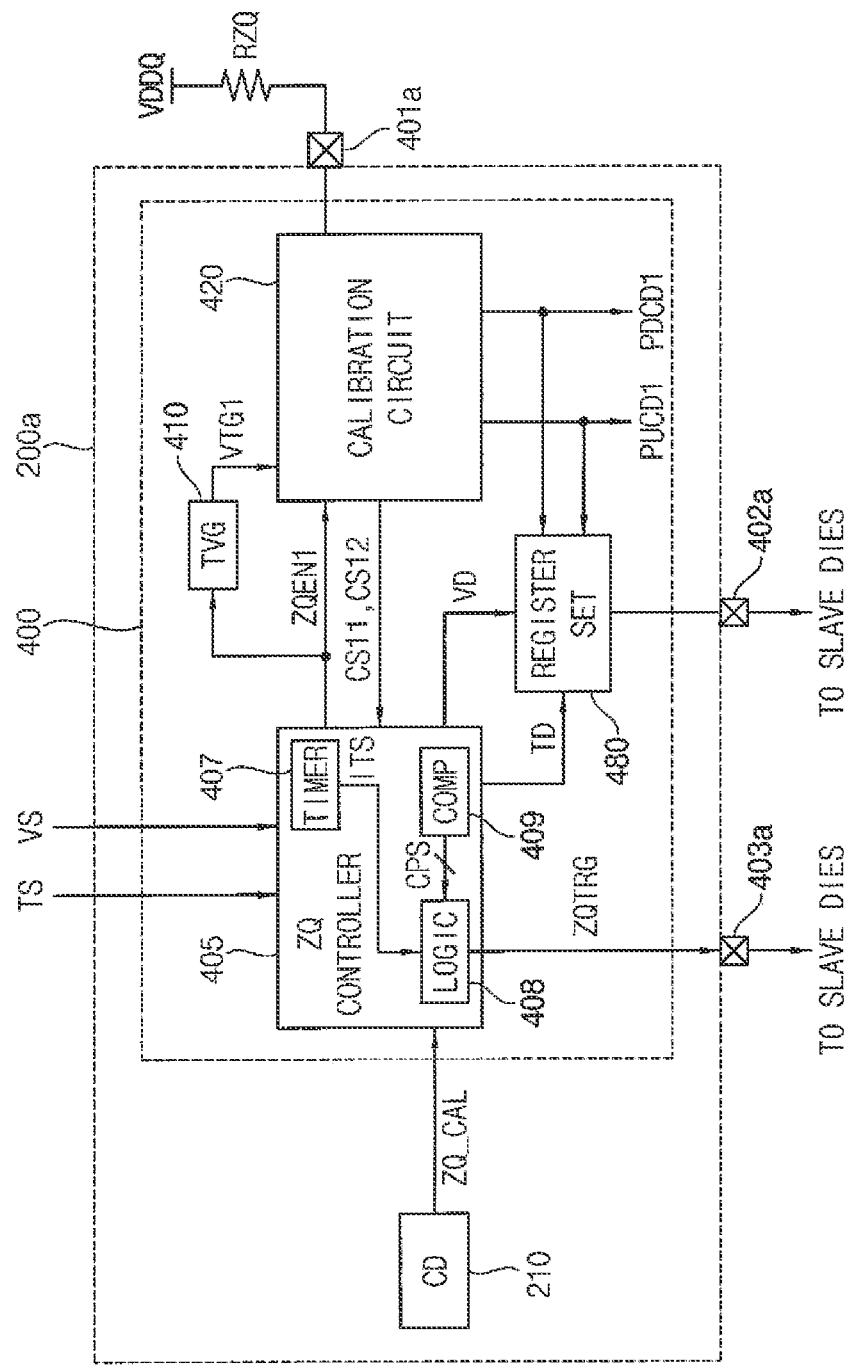
FIG. 7 illustrates a block diagram of an impedance calibration circuit in the master die in FIG. 2 according to example embodiments.

FIG. 7 illustrates a block diagram of an impedance calibration circuit in the master die in FIG. 2 according to example embodiments.

Referring to FIG. 7, the impedance calibration circuit 400 may include a calibration (ZQ) controller 405, a calibration circuit 420, a target voltage generator (TVG) 410 and a first register set 480.

The calibration controller 405 may receive the impedance calibration command ZQ_CAL from the command decoder (i.e., a corresponding command decoder) 210 in the master die 200a.

The calibration circuit 420 may be connected to the external resistor RZQ through the impedance pad 401a, may perform the impedance calibration operation in response to a calibration enable signal ZQEN1 from the calibration controller 405 to provide a first pull-up control code PUCD1 and a first pull-down control code PDCD1 to the output driver 360, may store the first pull-up control code PUCD1 and the first pull-down control code PDCD1 in the first register set 480 as first calibration data, and may provide the calibration controller 405 with a first comparison signal CS11 and a second comparison signal CS12 indicating that the impedance calibration operation is completed. The calibration circuit 420 may perform the impedance calibration operation for various operating voltages and operating temperatures.

The target voltage generator 410 may generates a target VOH voltage (hereinafter, also referred to as "VTG1") in response to the calibration enable signal ZQEN1 and may provide the target VOH voltage VTG1 to the calibration circuit 420.

The first register set 480 may be connected to the slave dies 200b-200k through the first connection pad 402a, may store the first pull-up control code PUCD1 and the first pull-down control code PDCD1, and may store voltage data VD and temperature data TD associated with the impedance calibration operation.

The calibration controller 405 may include a timer 407, a comparator (COMP) 409 and a logic 408. The calibration controller 405 may receive a voltage signal VS representing an operating voltage in the impedance calibration operation and a temperature signal TS representing an operating temperature in the impedance calibration operation and may store the voltage signal VS and the temperature signal TS in the first register set 480, as the voltage data VD and the temperature data TD, respectively.

The timer 407 may active calibration enable signal ZQEN1 during an impedance calibration period which is determined according to a specification of the semiconductor memory device 100, in response to the impedance calibration command ZQ_CAL. In addition, the timer 407 may generate an interval signal ITS that is periodically activated during the idle period and may provide the interval signal ITS to the logic 408.

When the calibration controller 405 receives the voltage signal VS and the temperature signal TS during the idle period, the comparator 409 may compare the voltage signal VS (a second voltage) and the temperature signal TS (a second temperature) with the voltage data VD and the temperature data TD which are pre-stored in the first register set 480, may activate the calibration enable signal ZQEN1 when a first difference between the voltage signal VS and the voltage data VD and a second difference between the temperature signal TS and the temperature data TD exceed a reference range and may provide the logic 408 with a comparison signal CPS indicating the first difference and the second difference. The calibration circuit 420 may perform a background impedance calibration operation in response to the calibration enable signal ZQEN1 that is activated during the idle period and may store, in the first register set 480, third calibration data associated with the background impedance calibration operation, the second voltage and the second temperature.

The logic 408 may receive the interval signal ITS and the comparison signal CPS and may provide a calibration trigger signal ZQTRG to the slave dies 200b~200k through a signal pad 403a when the comparison signal CPS indicating that the first difference and the second difference exceed the reference range.

Figure 8:
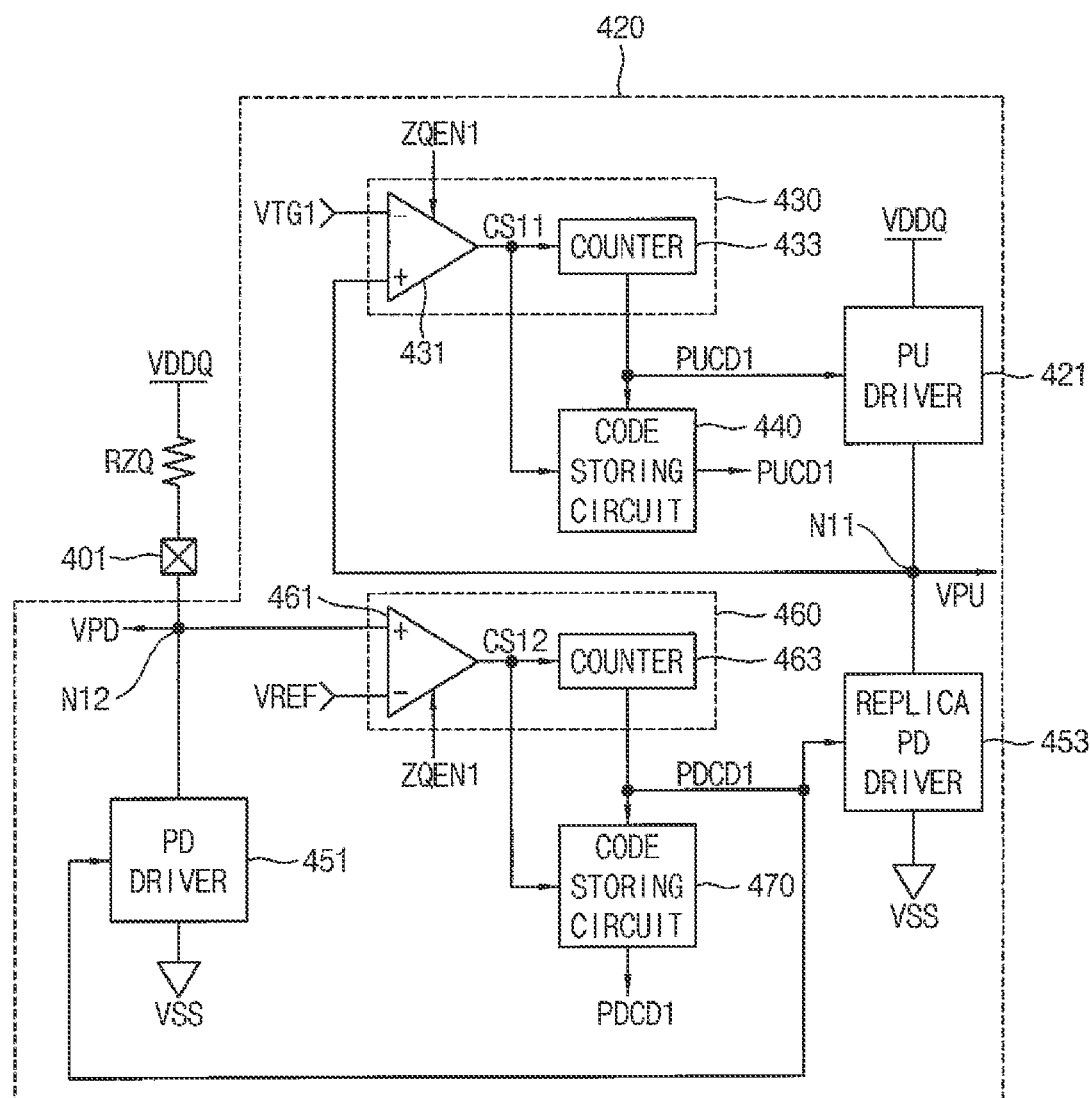
FIG. 8 illustrates a block diagram of a calibration circuit in the impedance calibration circuit of FIG. 7 according to example embodiments.

FIG. 8 illustrates a block diagram of a calibration circuit in the impedance calibration circuit of FIG. 7 according to example embodiments.

Referring to FIG. 8, the calibration circuit 420 includes a pull-up (PU) driver 421, a first code generator 430, a first code storing circuit 440, a pull-down (PD) driver 451, a replica pull-down (PD) driver 453, a second code generator 460, and a second code storing circuit 470.

The pull-up driver 421 is connected between the power supply voltage VDDQ and a first node N11, and may have a configuration similar to the pull-up driver 361 in FIG. 5. The replica pull-down driver 453 is connected between the first node N11 and the ground voltage VSS, and may have a configuration similar to the pull-down driver 363 in FIG. 5. The pull-down driver 451 is connected between a second node N12 and the ground voltage VSS, and the second node N12 is coupled to the impedance pad 401 coupled to the external resistor RZQ. The pull-down driver 451 may have a configuration similar to the pull-down driver 363 in FIG. 5.

The first code generator 430 may generate the first pull-up control code PUCD1 obtained from a result of comparing a first target VOH voltage VTG1 with a first voltage (or a pull-up voltage) VPU of the first node N11. The first code generator 430 includes a first comparator 431 and a first counter 433.

The first comparator 431 may be enabled in response to the calibration enable signal ZQEN1, may compare the first target VOH voltage VTG1 with the first voltage VPU to output the first comparison signal CS11, and may provide the first comparison signal CS11 to the first counter 433 and the first code storing circuit 440. The first counter 433 may perform a counting operation in response to the first comparison signal CS11 to generate the first pull-up control code PUCD1 and may perform a counting operation to increase or decrease the first pull-up control code PUCD1 until a logic level of the first comparison signal CS11 transits. The first counter 433 may provide the first pull-up control code PUCD1 to the pull-up driver 421 and the first code storing circuit 440.

The pull-up driver 421 may adjust/calibrate a pull-up impedance in response to the first pull-up control code PUCD1. The first pull-up control code PUCD1 may be calibrated/changed until the first target VOH voltage VTG1 becomes substantially the same as the pull-up voltage VPU.

The first code storing circuit 440 may store the first pull-up control code PUCD1 when the logic level of the first comparison signal CS11 transits. In other words, the first code storing circuit 440 may store the first pull-up control code PUCD1 when the first target VOH voltage VTG1 becomes the pull-up voltage VPU.

The second code generator 460 may generate the first pull-down control code PDCD1 obtained from a result of comparing a second voltage (or a pull-down voltage) VPD of the second node N12 with a reference voltage VREF. The second code generator 460 includes a second comparator 461 and a second counter 463. The second comparator 461 may be enabled in response to the calibration enable signal ZQEN1, may compare the reference voltage VREF with the second voltage VPD to output the second comparison signal CS12 and may provide the second comparison signal CS12 to the second counter 463 and the second code storing circuit 470.

The second counter 463 may perform a counting operation in response to the second comparison signal CS12 to generate the first pull-down control code PDCD1 and may perform a counting operation to increase or decrease first the pull-down control code PDCD1 until a logic level of the second comparison signal CS12 transits. The second counter 463 may provide the first pull-down control code PDCD1 to the pull-down driver 451, the replica pull-down driver 453, and the second code storing circuit 470.

The pull-down driver 451 may adjust/calibrate a pull-down impedance in response to the first pull-down control code PDCD1. The replica pull-down driver 453 may adjust/calibrate a pull-down impedance in response to the first pull-down control code PDCD1. The first pull-down control code PDCD1 may be calibrated/changed until the pull-down voltage VPD becomes substantially the same as the reference voltage VREF. The second code storing circuit 470 may store the first pull-down control code PDCD1 when the logic level of the second comparison signal CS12 transits. In other words, the second code storing circuit 470 may store the first pull-down control code PDCD1 when the pull-down voltage VPD becomes the reference voltage VREF.

The calibration circuit 420 provides the first comparison signal CS11 and the second comparison signal CS12 to the calibration controller 405.

Figure 9:
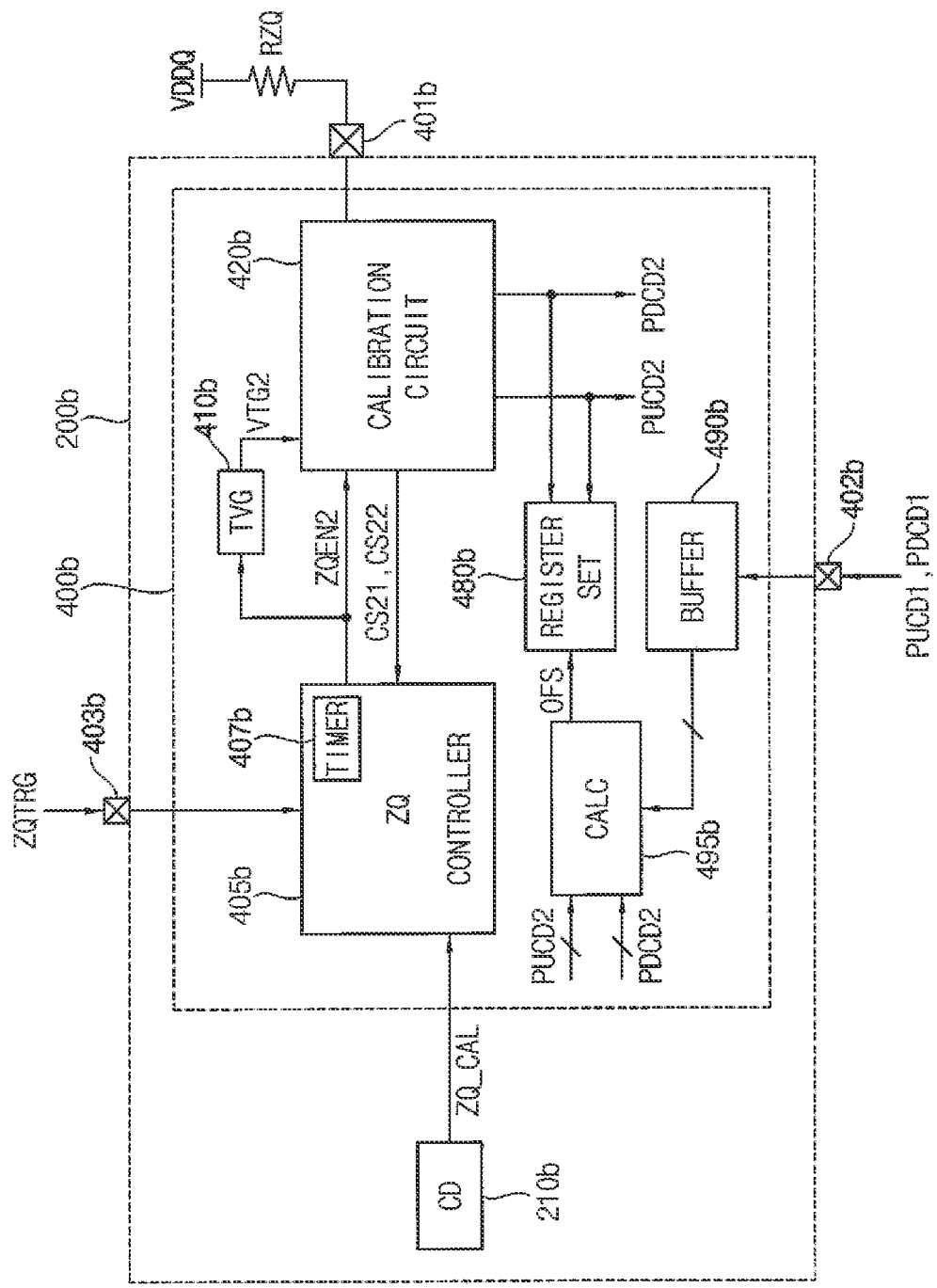
FIG. 9 illustrates a block diagram of an impedance calibration circuit in the slave die in FIG. 2 according to example embodiments.

FIG. 9 illustrates a block diagram of an impedance calibration circuit in the slave die in FIG. 2 according to example embodiments.

Referring to FIG. 9, the slave die 200b may include a command decoder 210b and an impedance calibration circuit 400b. The impedance calibration circuit 400b may include a calibration (ZQ) controller 405b, a calibration circuit 420b, a target voltage generator (TVG) 410b, a second register set 480b, a buffer 490b and a calculator (CALC) 495b.

The calibration controller 405b may receive the impedance calibration command ZQ_CAL from the command decoder (i.e., a corresponding command decoder) 210b in the slave die 200b. The calibration controller 405b may include a timer 407b, and the timer 407b may active a calibration enable signal ZQEN2 at a delayed timing which is pre-determined according to an impedance calibration order of the slave die 200b and may maintain an activated state of the calibration enable signal ZQEN2 during the impedance calibration period. In addition, the calibration controller 405b, during the idle period, may receive the calibration trigger signal ZQTRG through the master die 200a through a signal pad 403b, may active a calibration enable signal ZQEN2 at a delayed timing which is pre-determined according to an impedance calibration order of the slave die 200b and may maintain an activated state of the calibration enable signal ZQEN2 during the impedance calibration period.

The calibration circuit 420b may be connected to the external resistor RZQ through the impedance pad 401b, may perform the impedance calibration operation in response to the calibration enable signal ZQEN2 from the calibration controller 405b to provide a second pull-up control code PUCD2 and a second pull-down control code PDCD2 to the output driver, may store the second pull-up control code PUCD2 and the second pull-down control code PDCD2 in the second register set 480b as second calibration data, and may provide the calibration controller 405b with a first comparison signal CS21 and a second comparison signal CS22 indicating that the impedance calibration operation is completed. The target voltage generator 410b may generates a target VOH voltage VTG2 in response to the calibration enable signal ZQEN2 and may provide the target VOH voltage VTG2 to the calibration circuit 420b.

The buffer 490b may receive the first calibration data (i.e., the first pull-up control code PUCD1 and the first pull-down control code PDCD1) from the first register set 480 through a connection pad 402b and may store the first calibration data. The calculator 495b may compare the second pull-up control code PUCD2 and the second pull-down control code PDCD2 with the first calibration data stored in the buffer 490b, may generate offset data OFS corresponding to a difference between the second pull-up control code PUCD2 and the first pull-up control code PUCD1 and the second pull-down control code PDCD2 and the first pull-down control code PDCD1, and may store the offset data OFS in a row in the second register set 480b in which the second calibration data is stored during an idle period.

When the calibration controller 405b activates the calibration enable signal ZQEN2 again in response to the calibration trigger signal ZQTRG, the calibration circuit 420b may update the second pull-up control code PUCD2 and the second pull-down control code PDCD2 by a difference indicated by the offset data OFS instead of performing the impedance calibration operation. Therefore, the impedance calibration circuit 400b may reduce impedance calibration interval during the idle period.

Figure 10:
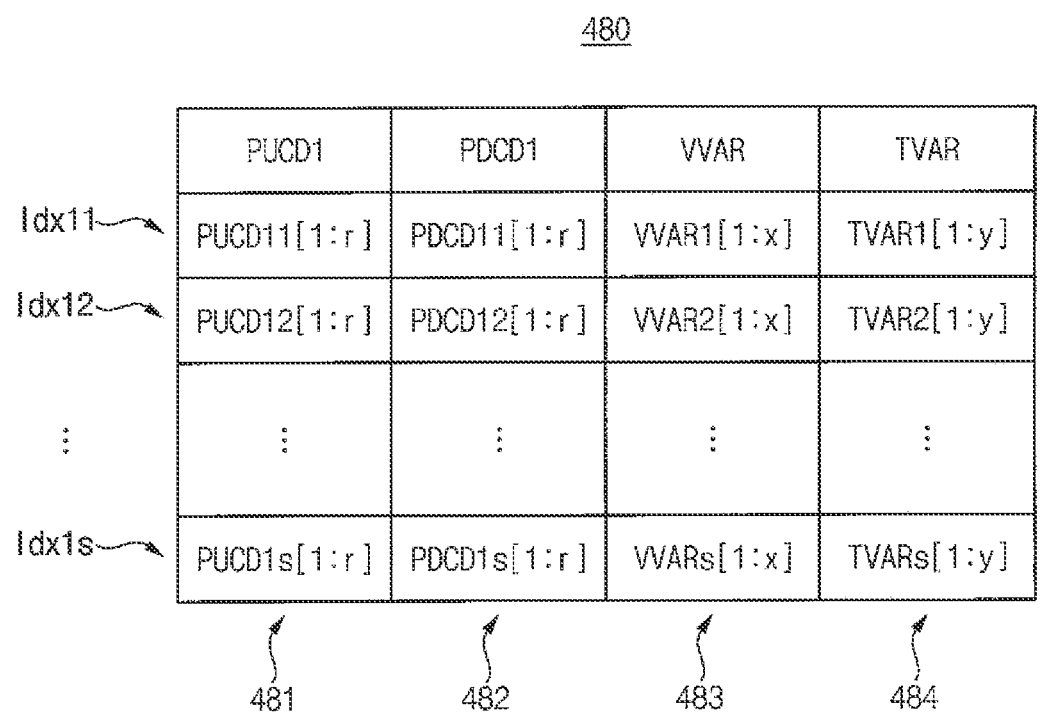
FIG. 10 illustrates an example of the first register set in the impedance calibration circuit in the master die in FIG. 7.

FIG. 10 illustrates an example of the first register set in the impedance calibration circuit in the master die in FIG. 7.

Referring to FIG. 10, each of a plurality of indexes Idx11~Idx1s (where, s in an integer greater than two) may store respective one of first pull-up control codes PUCD11[1:r]~PUCD1s[1:r] and respective one of first pull-down control codes PDCD11[1:r]~PDCD1s[1:r] for respective one of a plurality of voltage variance and temperature variance sets (VVAR1[1:x], TVAR1[1:y]~(VVARs[1:x], TVARs[1:y]). Here, each of x and y is an integer greater than two. Respective one of first pull-up control codes PUCD11[1:r]~PUCD1s[1:r] and respective one of first pull-down control codes PDCD11[1:r]~PDCD1s[1:r] may be stored under various operating voltages during the initialization sequence. Additional pull-up control codes, pull-down control codes and voltage-temperature sets may be further stored in the first register set 480 as voltage and temperature change during the idle period.

The first register set 480 may include a plurality of columns 481, 482, 483 and 484. The first pull-up control code PUCD1 may be stored in the column 481, the first pull-down control code PDCD1 may be stored in the column 482, the voltage variance VVAR may be stored in the column 483 and the temperature variance TVAR may be stored in the column 484. A representative value covering a specified range may be stored as each of the voltage variance VVAR and the temperature variance TVAR. A mean value associated with the specified range may be stored as the representative value. When the representative value is stored as each of the voltage variance VVAR and the temperature variance TVAR, voltages and temperatures within the specified range are considered as the same voltage and the same temperature, respectively. Since the logic 408 in FIG. 7 activates the calibration trigger signal ZQTRG based on the interval signal ITS and the comparison signal CPS, the representative value may prevent the impedance calibration operation from being performed frequently. That is, when a change of the voltage and the temperature exceeds a reference range, the background impedance calibration operation may be performed aperiodically. In addition, since the background impedance calibration operation is performed when a voltage and a temperature exceeding the reference range are detected, the background impedance calibration operation is performed when an operating temperature of the semiconductor memory device 100 changes greatly.

Figure 11:
FIG. 11 illustrates an example of the second register set in the impedance calibration circuit in the slave die in FIG. 9.

FIG. 11 illustrates an example of the second register set in the impedance calibration circuit in the slave die in FIG. 9.

Referring to FIG. 11, the second register set 480b may include second pull-up control codes PUCD21[1:r]~PUCD2s[1:r], second pull-down control codes PDCD21[1:r]~PDCD2s[1:r] and offset data OFS21[1:z]~OFS2s[1:z] (z is an integer greater than two) which are obtained in the impedance calibration operation during the initialization sequence. When the second pull-up control codes PUCD21[1:r]~PUCD2s[1:r] and the second pull-down control codes PDCD21[1:r]~PDCD2s[1:r] are to be updated in the impedance calibration operation during the idle period, the second pull-up control codes PUCD21[1:r]~PUCD2s[1:r] and the second pull-down control codes PDCD21[1:r]~PDCD2s[1:r] may be updated by a difference indicated by respective one of the offset data OFS21[1:z]~OFS2s[1:z].

The second register set 480b may include a plurality of columns 481b, 482b and 485b. The second pull-up control code PUCD2 may be stored in the column 481b, the second pull-down control code PDCD2 may be stored in the column 482b and the offset data OFS may be stored in the column 485b.

Figure 12:
FIG. 12 illustrates an example of the second register set in the impedance calibration circuit in the slave die in FIG. 9.

FIG. 12 illustrates an example of the second register set in the impedance calibration circuit in the slave die in FIG. 9.

Referring to FIG. 12, a second register set 480c may include second pull-up control codes PUCD31[1:r]~PUCD3s[1:r], second pull-down control codes PDCD31[1:r]~PDCD3s[1:r] and offset data OFS31[1:z]~OFS3s[1:z] which are obtained in the impedance calibration operation during the initialization sequence. When the second pull-up control codes PUCD31[1:r]~PUCD3s[1:r] and the second pull-down control codes PDCD31[1:r]~PDCD3s[1:r] are to be updated in the impedance calibration operation during the idle period, the second pull-up control codes PUCD31[1:r]~PUCD3s[1:r] and the second pull-down control codes PDCD31[1:r]~PDCD3s[1:r] may be updated by a difference indicated by respective one of the offset data OFS31[1:z]~OFS3s[1:z].

The second register set 480c may include a plurality of columns 481c, 482c and 485c. The second pull-up control code PUCD3 may be stored in the column 481c, the second pull-down control code PDCD3 may be stored in the column 482c and the offset data OFS may be stored in the column 485c.

Figure 13:
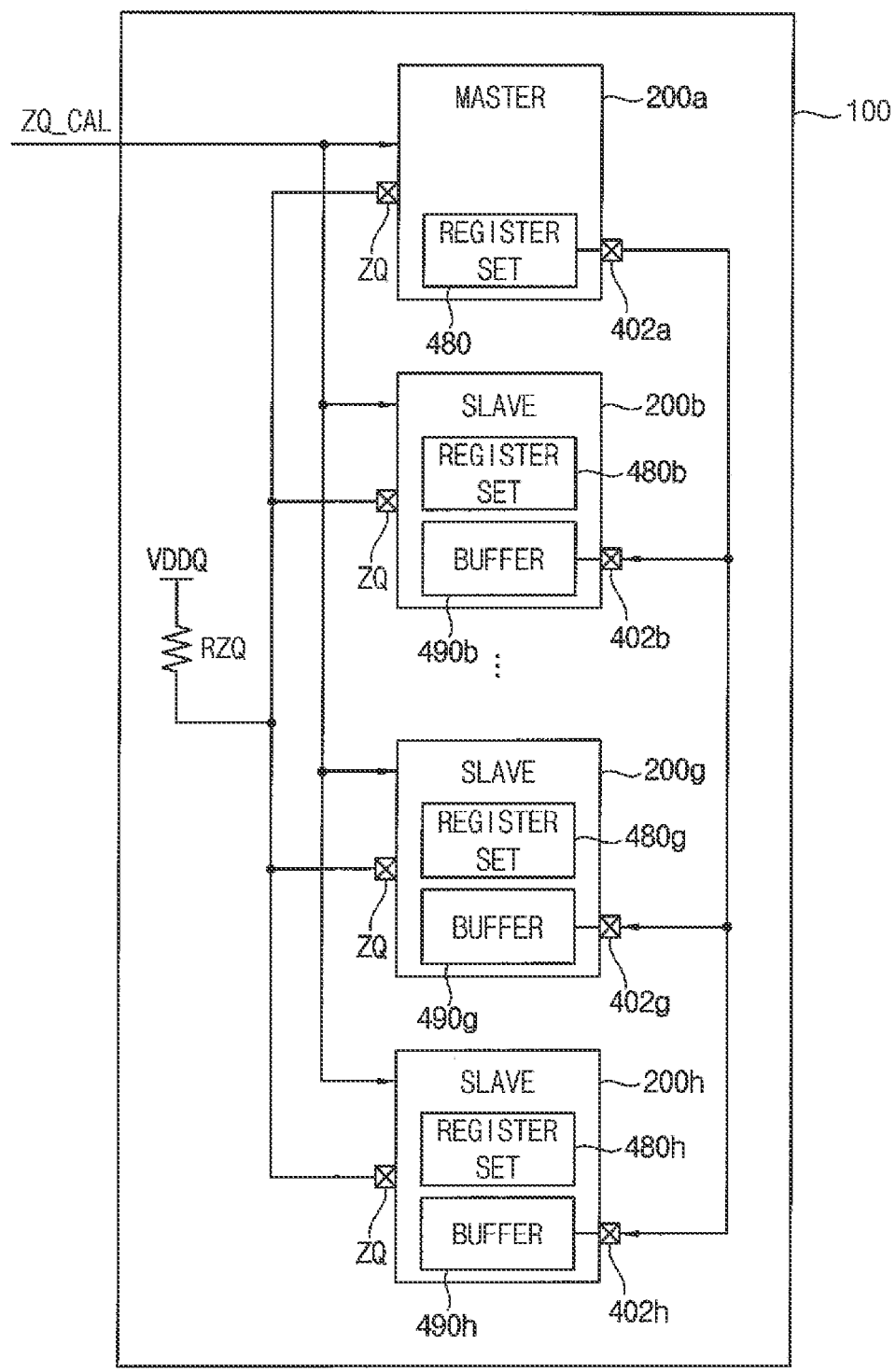
FIGS. 13 and 14 illustrate that the impedance calibration operation is performed during the initialization sequence in the semiconductor memory device in FIG. 1, according to example embodiments.
Figure 14:
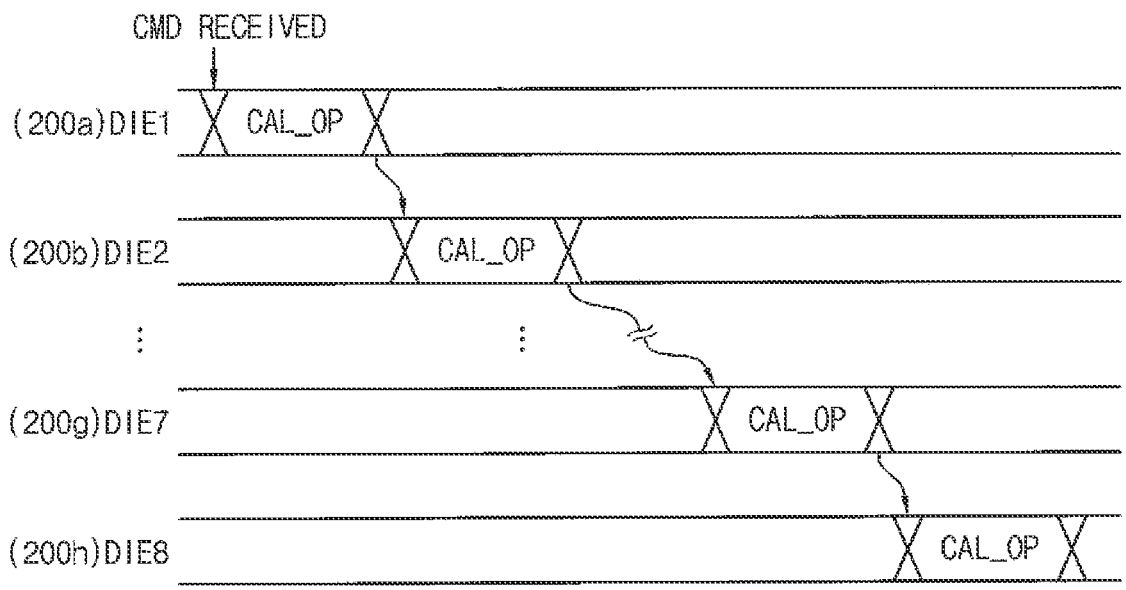

FIGS. 13 and 14 illustrate that the impedance calibration operation is performed during the initialization sequence in the semiconductor memory device in FIG. 1, according to example embodiments.

In FIG. 13, the semiconductor memory device 100 in FIG. 1 includes the master die 200a and slave dies 200b~200h. Here, h is an integer greater than two.

Referring to FIG. 13, each of the master die 200a and the slave dies 200b~200h includes an impedance pad ZQ connected to the external resistor RZQ, the master die 200a includes the first register set 480 connected to the first connection pad 402a and each of the slave dies 200b~200h includes respective one of second registers sets 480b~480h and respective one of buffers 490b~490h. Each of the buffers 490b~490h may be connected to the first register set 480 in the master die 200a through respective one of second connection pads 402b~402h.

Referring to FIG. 14, each of the master die 200a (DIE1) and slave dies 200b~200h (DIE2~DIE8) receives the impedance calibration command ZQ_CAL from the memory controller 30 during the initialization sequence, and each of the master die 200a and slave dies 200b-200h performs the impedance calibration operation (CAL_OP) sequentially. The master die 200a stores the first calibration data, the operating voltage and the operating temperature in the first register set 480 and each of the slave dies 200b~200h stores the second calibration data and the offset data in respective one of the second register sets 480b~480h.

Figure 15:
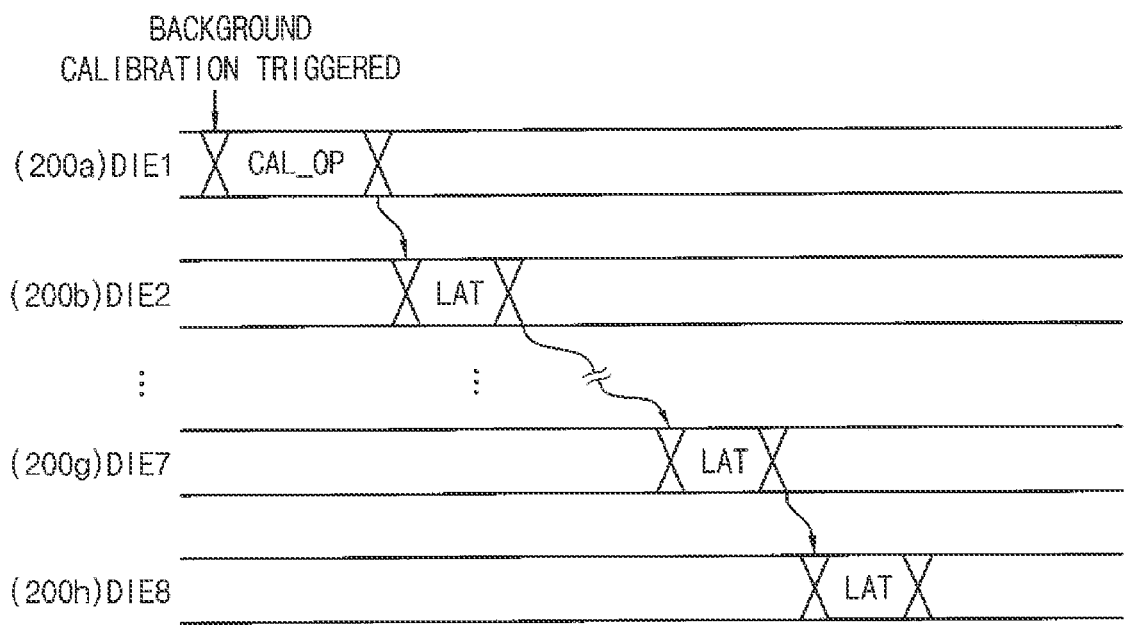
FIG. 15 illustrates that the background impedance calibration operation is performed during the idle period in the semiconductor memory device in FIG. 1, according to example embodiments.

FIG. 15 illustrates that the background impedance calibration operation is performed during the idle period in the semiconductor memory device in FIG. 1, according to example embodiments.

Referring to FIG. 15, when a change of the voltage and the temperature exceeds the reference range, the master die 200a activates the calibration enable signal ZQEN1 internally, performs the background impedance calibration operation (CAL_OP), stores the third calibration data in the first register set 480, and provides the calibration trigger signal ZQTRG to each of the slave dies 200b~200h.

Each of the slave dies 200b~200h updates the second calibration data LAT that is pre-stored based on the offset data stored in respective one of the second register sets 480b~480h in response to the calibration trigger signal ZQTRG. Since each of the slave dies 200b~200h adjusts the second calibration data by a difference indicated by the offset data and stores the adjusted second calibration data instead of performing the impedance calibration operation, each of the slave dies 200b~200h may reduce an interval corresponding to a background impedance calibration interval during the idle period.

As described with reference to FIGS. 1 and 13, the master die 200a and the slave dies 200b~200h are provided (formed) in the same board 110 and receive the operating voltage VDD from the PMIC 130. Process difference for each of the master die 200a and the slave dies 200b~200h may be a parameter that is different when manufacturing the master die 200a and the slave dies 200b~200h, but may be a parameter that is not variable when the master die 200a and the slave dies 200b~200h are operating. Considering the voltage and the temperature, since the master die 200a and the slave dies 200b~200h are adjacent in a package and thermal conductivity of the package is generally high, a temperature change of each of the master die 200a and the slave dies 200b~200h is similar with respect to each other. In addition, since each of the master die 200a and the slave dies 200b~200h receives the operating voltage VDD from the PMIC 130 through a similar path, a voltage change of each of the master die 200a and the slave dies 200b~200h is similar with respect to each other.

Therefore, the master die 200a stores the first calibration data in the first register set, which is obtained in the impedance calibration operation during the initialization sequence and each of the slave dies 200b~200h stores the second calibration data and the offset data corresponding to the first calibration data and the second calibration data in each of the second register set, which is obtained in the impedance calibration operation during the initialization sequence. When the voltage and the temperature change during the idle period, each of the slave dies 200b~200h updates the second calibration data based on the offset data without performing an extra impedance calibration operation. Therefore, each of the slave dies 200b~200h may reduce an interval corresponding to a background impedance calibration interval during the idle period.

Figure 16A:
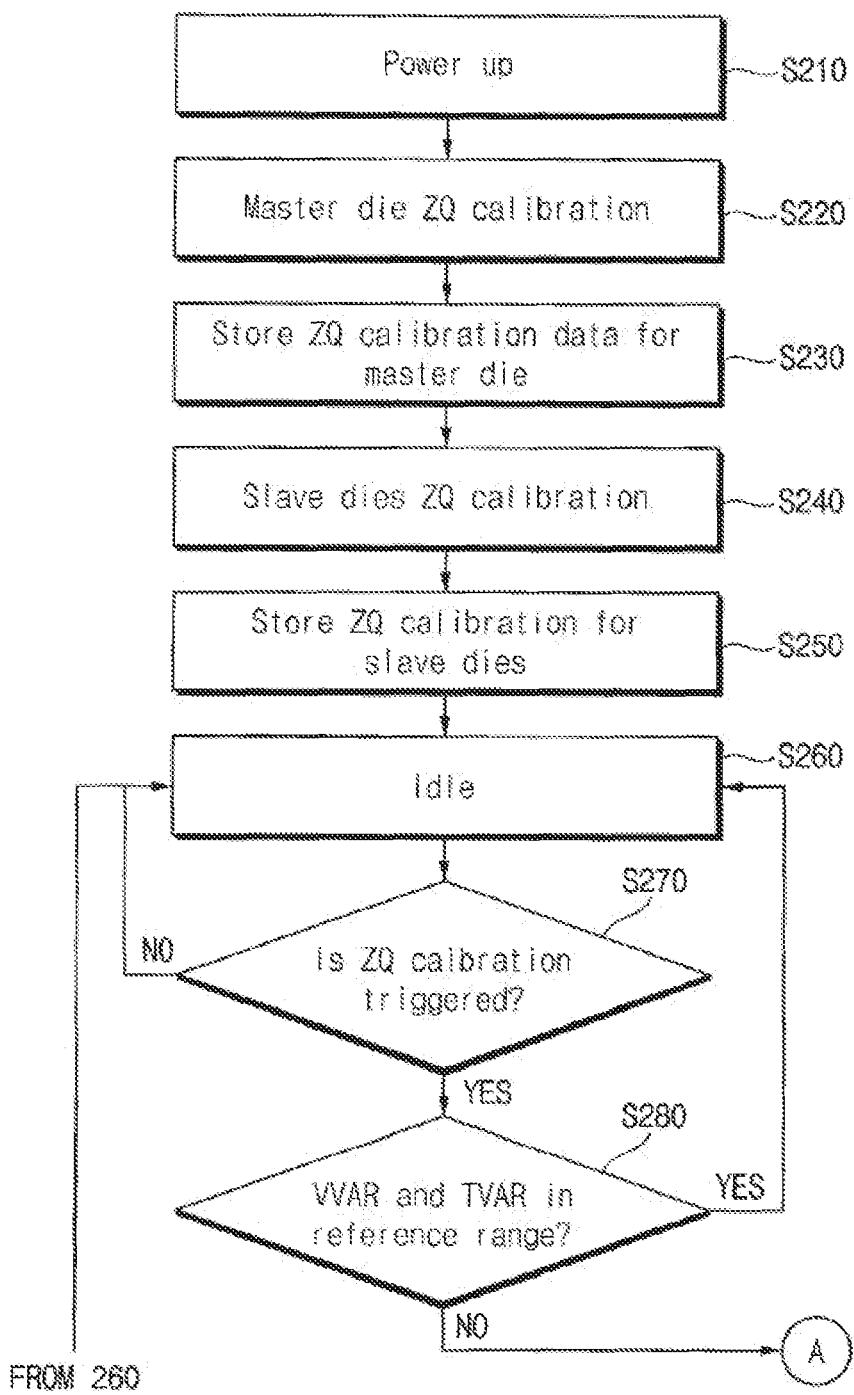
FIGS. 16A and 16B are flowcharts illustrating a method of operating a semiconductor memory device including multi-dies according to example embodiments.
Figure 16B:
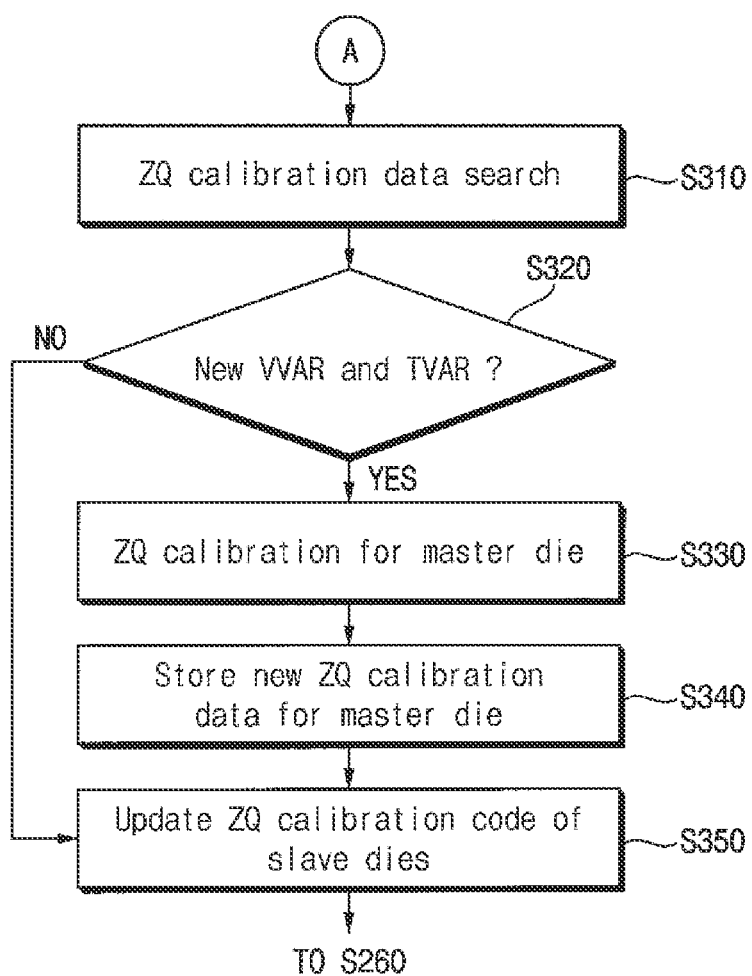

FIGS. 16A and 16B are flowcharts illustrating a method of operating a semiconductor memory device including multi-dies according to example embodiments.

Referring to FIGS. 1 through 16B, there is provided a method of operating the semiconductor memory device 100 including the master die 200a and the plurality of slave dies 200b~200k which are commonly connected to the external resistor RZQ provided in the board 110. According to the method, power is applied to the semiconductor memory device 100 (power up) (operation S210) and the initialization sequence is performed. During the initialization sequence, the impedance calibration command is applied to the master die 200a and the slave dies 200b~200k from the memory controller 30.

The master die 200a performs the first impedance calibration operation (operation S220) and the master die 200a stores the first calibration data, the voltage and the temperature associated with the first impedance calibration operation in the first register set 480 (operation S230).

Each of the slave dies 200b~200k performs the second impedance calibration operation (operation S240) and each of the slave dies 200b~200k stores the second calibration data obtained through the second impedance calibration operation and the offset data corresponding to the difference between the first calibration data and the second calibration data in the second register set 480*b* (operation S250).

The semiconductor memory device 100 enters into the idle mode (operation S260) and performs a write operation and/or a read operation. When the operating voltage and the operating temperature of the semiconductor memory device 100 change, the master die 200*a* determines whether the impedance calibration operation is triggered (operation S270). When the impedance calibration operation is not triggered (NO in operation S270), the semiconductor memory device 100 enters into the idle mode.

When the impedance calibration operation is triggered (YES in operation S270), the voltage/temperature sensor determines whether the voltage change VVAR and the temperature change TVAR are within the reference range (operation S280).

When it is determined that the voltage change VVAR and the temperature change TVAR are within the reference range (YES in operation S280), the semiconductor memory device 100 enters into the idle mode. When it is determined that the voltage change VVAR and the temperature change TVAR exceed the reference range (NO in operation S280), the calibration controller 405 in the master die 200*a* determines in operation S320 whether the voltage change VVAR and the temperature change TVAR are new entries based on whether the voltage change VVAR and the temperature change TVAR match entries stored in the first register set 480 by searching the first register set 480 (operation S310). The calibration controller 405 may search the temperature first and then may search the voltage when the temperature matching is found.

When it is determined that the voltage change VVAR and the temperature change TVAR are new entries which do not match the entries stored in the first register set 480 (YES in operation S320), the master die 200*a* performs a background calibration operation under the new voltage and the new temperature (operation S330), and stores third calibration data in the first register set 480 (operation S340). The calibration controller 405 provides the calibration trigger signal ZQTRG to each of the slave dies 200*b*~200*k*. Each of the slave dies 200*b*~200*k* updates the second calibration data by a difference indicated by the offset data in response to the calibration trigger signal ZQTRG and stores the updated second calibration data in the second register set 480*b* (operation S350). The semiconductor memory device 100 enters into the idle mode (operation S260).

When it is determined that the voltage change VVAR and the temperature change TVAR are not new entries (NO in operation S320), each of the slave dies 200*b*~200*k* updates the second calibration data by a difference indicated by the offset data in response to the calibration trigger signal ZQTRG and stores the updated second calibration data in the second register set 480*b* (operation S350).

Figure 17:
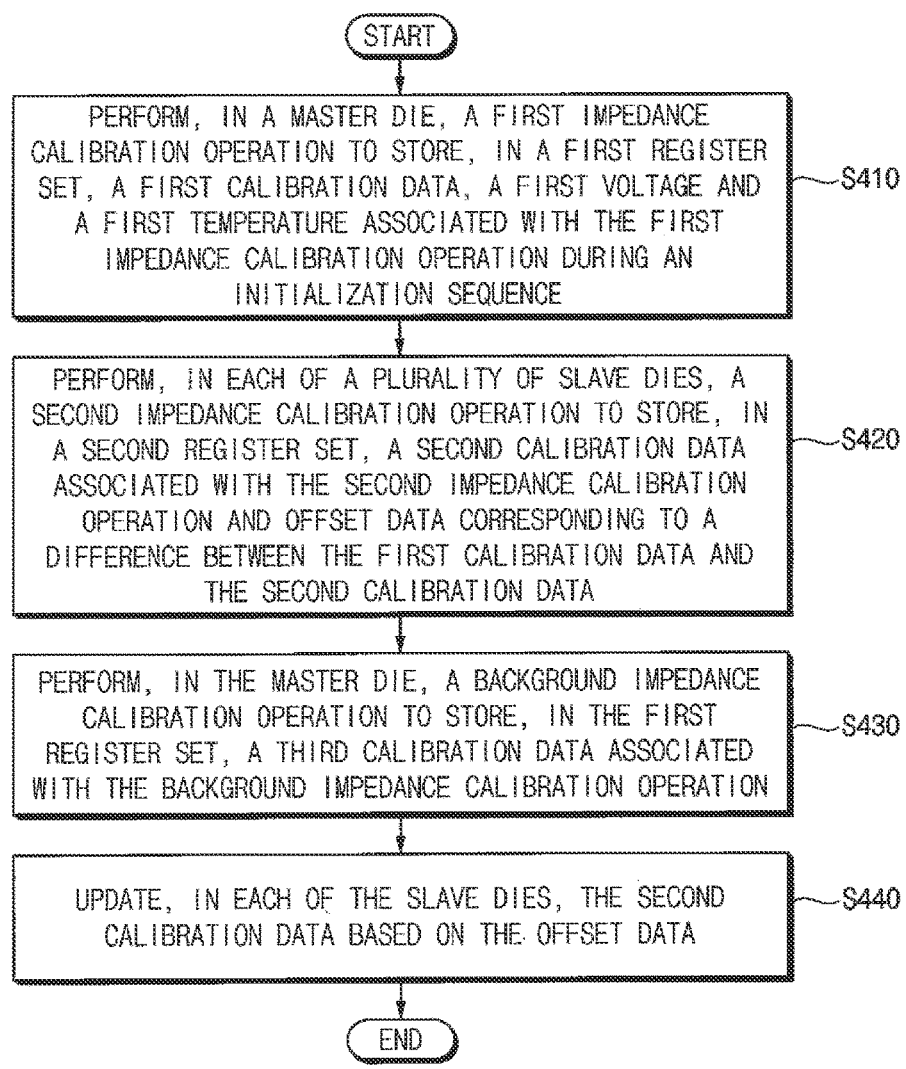
FIG. 17 is a flowchart illustrating a method of operating a semiconductor memory device including multi-dies according to example embodiments.

FIG. 17 is a flowchart illustrating a method of operating a semiconductor memory device including multi-dies according to example embodiments.

Referring to FIGS. 1 through 17, in a method of operating the semiconductor memory device 100 including multi-dies, the master die 200 performs the first impedance calibration operation to store the first calibration data, associated voltage, and associated temperature in the first register set 480 therein during the initialization sequence (operation S410).

Each of the slave dies 200*b*~200*k* performs the second impedance calibration operation to store the second calibration data and the offset data, corresponding to difference between the first calibration data and the second calibration data, in the second register set 480*b* during the initialization sequence (operation S420).

When the operating voltage change and the operating temperature change exceed the reference range during the idle period of the semiconductor memory device 100, the master die 200*a* performs the background impedance calibration operation to store the third calibration data in the first register set 480 (operation S430) and provides the provides the calibration trigger signal ZQTRG to each of the slave dies 200*b*~200*k*.

Each of the slave dies 200*b*~200*k* updates the second calibration data by a difference indicated by the offset data stored in the second register set 480*b* in response to the calibration trigger signal ZQTRG (operation S440). Each of the slave dies 200*b*~200*k* stores the updated second calibration data in the second register set 480*b*.

Figure 18:
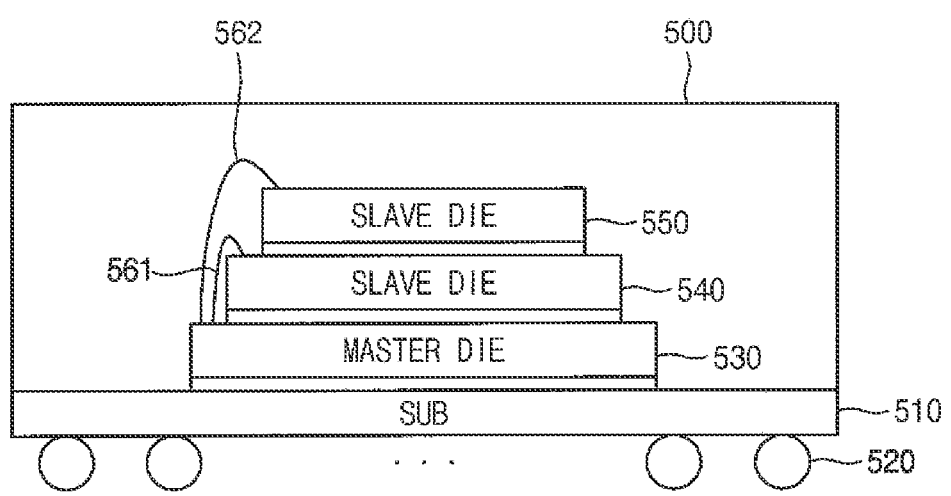
FIG. 18 is a schematic diagram of a multi-chip package including a semiconductor memory device according to example embodiments.

FIG. 18 is a schematic diagram of a multi-chip package including a semiconductor memory device according to example embodiments.

Referring to FIG. 18, a multi-chip package 500 may include a plurality of memory dies 530, 540, and 550 which are sequentially stacked on a package substrate 510. The memory die 530 may be a master die and the memory dies 540 and 550 may be slave dies. The master die 530 may have substantially the same configuration of the master die 200*a* of FIG. 2 and each of the slave dies 540 and 550 may have substantially similar configuration of the master die 200*a* of FIG. 2.

A through-silicon via (TSV) (not shown), a bonding wire (not shown), a bump (not shown), or a solder ball 520 may be used to electrically connect the memory dies 530, 540, and 550 with one other.

Each of the memory dies 530, 540, and 550 may employ an impedance calibration circuit. The master die 530 may employ the impedance calibration circuit 400 in FIG. 7 and each of the slave dies 540 and 550 may employ the impedance calibration circuit 400*b* in FIG. 9.

The master die 530 may be connected to the slave die 540 through a wire 561 and may be connected to the slave die 550 through a wire 562. A first register set of the master die 520 may be connected to a buffer in the slave die 540 through the wire 561 and the first register set of the master die 520 may be connected to a buffer in the slave die 550 through the wire 562.

Figure 19:
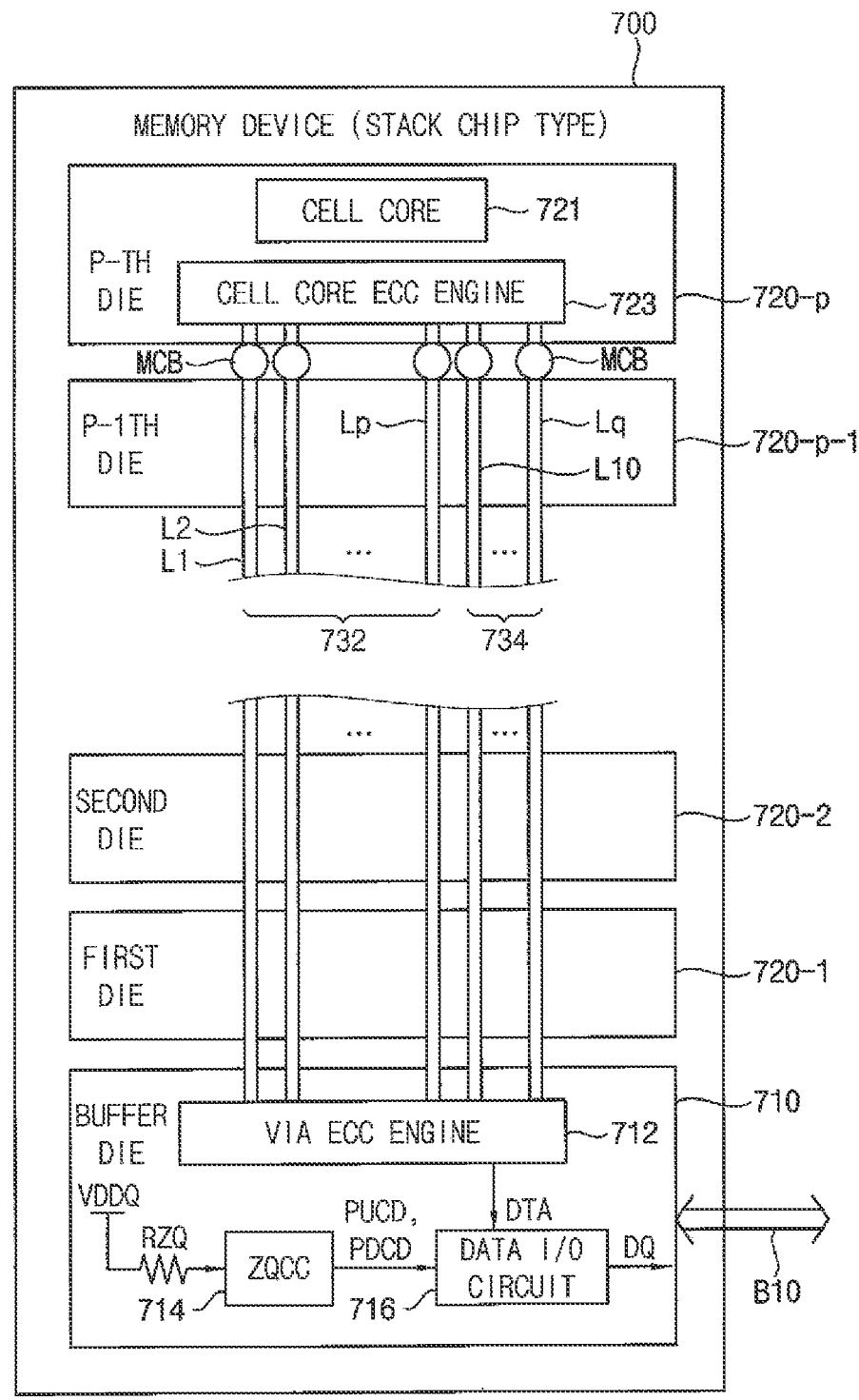
FIG. 19 is a block diagram illustrating a semiconductor memory device according to example embodiments.

FIG. 19 is a block diagram illustrating a semiconductor memory device according to example embodiments.

Referring to FIG. 19, a semiconductor memory device 700 may include at least one buffer die 710 and a plurality of memory dies 720-1 to 720-*p* (p is a natural number equal to or greater than three) providing a soft error analyzing and correcting function in a stacked chip structure.

The plurality of memory dies 720-1 to 720-*p* may be stacked on the buffer die 710, and may convey data through a plurality of through silicon via (TSV) lines.

Each of the memory dies 720-1 to 720-*p* may include cell core 721 to store data and a first type ECC engine 723 to generate transmission parity bits (e.g., transmission parity data) based on transmission data to be sent to the at least one buffer die 710. The first type ECC engine 723 may be referred to as 'cell core ECC engine'. The cell core 721 may include a plurality of memory cells having DRAM cell structure.

The buffer die 710 may include a second type ECC engine 712, which may correct a transmission error using the transmission parity bits when a transmission error is detected from the transmission data received through the TSV liens, and generate error-corrected data. The second type ECC engine 712 may be referred to as 'via ECC engine'.

The buffer die 710 may further include an impedance calibration circuit (ZQCC) 714 and a data I/O circuit 716. The impedance calibration circuit 714 may be connected to an external resistor RZQ coupled to the power supply voltage VDDQ.

The impedance calibration circuit 714 may employ the impedance calibration circuit 400 in FIG. 7. The impedance calibration circuit 714 may provide a pull-up control code PUCD and a pull-down control code PDCD to the data I/O circuit 716. The data I/O circuit 716 may drive data DTA provided from the second type ECC engine 712 based on the pull-up control code PUCD and the pull-down control code PDCD to transmit a data signal DQ having a target VOH voltage to an external memory controller (for example, the memory controller 30).

In the semiconductor memory device 700 of FIG. 19, only the buffer die 710 is connected to the external memory controller. The impedance calibration circuit 714, during the initialization sequence, performs the first impedance calibration operation to determine a resistance of an output driver and a VOH voltage of the first output driver with respect to the memory die 720-1, stores first calibration data, a voltage and a temperature associated with the first impedance calibration operation in a register set therein, performs a second impedance calibration operation with respect to each of the memory dies 720-2~720-p, and stores the second calibration data associated with the second impedance calibration operation and offset data corresponding to difference between the first impedance calibration and the second impedance calibration in the register set.

In addition, the impedance calibration circuit 714, when the impedance calibration operation is triggered during an idle mode, updates the second calibration data by a difference indicated by the offset data with respect to each of the memory dies 720-2~720-p and stores the updated second calibration data in the register set. Therefore, the impedance calibration circuit 714 may reduce an interval corresponding to an impedance calibration interval during the idle mode.

The semiconductor memory device 700 may be, e.g., a stack chip type memory device or a stacked memory device that conveys data and control signals through the TSV lines. The TSV lines may be also called 'through electrodes'.

The first type ECC engine 723 may perform error correction on data that is output from the memory die 720-p before the transmission data is sent.

A transmission error that occurs at the transmission data may be due to, e.g., noise that occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

A data TSV line group 732, which is formed at one memory die 720-p, may include TSV lines L1 to Lp, and a parity TSV line group 734 may include TSV lines L10 to Lq.

The TSV lines L1 to Lp of the data TSV line group 732 and the parity TSV lines L10 to Lq of the parity TSV line group 734 may be connected to micro bumps MCB, which are correspondingly formed among the memory dies 720-1 to 720-p.

The semiconductor memory device 700 may have a three-dimensional (3D) chip structure or a 2.5D chip structure to communicate with the host through a data bus B10.

The buffer die 710 may be connected with the memory controller through the data bus B10.

The first type ECC engine 723, denoted as the cell core ECC engine, may output transmission parity bits as well as the transmission data through the parity TSV line group 734 and the data TSV line group 732, respectively. The output transmission data may be data that is error-corrected by the first type ECC engine 723.

The second type ECC engine 712, denoted as the via ECC engine, may determine whether a transmission error occurs at the transmission data received through the data TSV line group 732, based on the transmission parity bits received through the parity TSV line group 734. When a transmission error is detected, the second type ECC engine 712 may correct the transmission error on the transmission data using the transmission parity bits. When the transmission error is uncorrectable, the second type ECC engine 712 may output information indicating an occurrence of an uncorrectable data error. When an error is detected from read data in a high bandwidth memory (HBM) or the stacked memory structure, the error may be an error occurring due to noise while data is transmitted through the TSV.

According to example embodiments, as illustrated in FIG. 19, first type ECC engine 723, denoted as the cell core ECC engine may be included in the memory die, and the second type ECC engine 712, denoted as the via ECC engine may be included in the buffer die. Accordingly, it may be possible to detect and correct soft data fail. The soft data fail may include a transmission error that is generated due to noise when data is transmitted through TSV lines.

Figure 20:
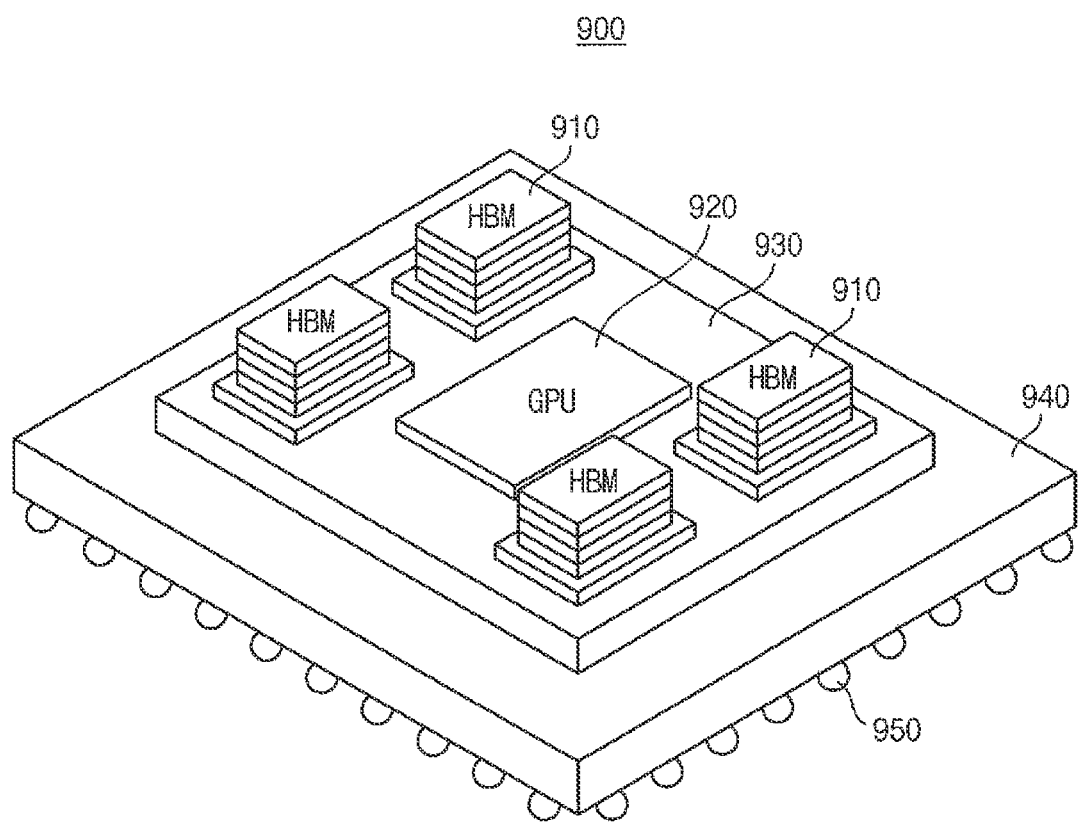
FIG. 20 is a configuration diagram illustrating a semiconductor package including the stacked memory device according to example embodiments.

FIG. 20 is a configuration diagram illustrating a semiconductor package including the stacked memory device according to example embodiments.

Referring to FIG. 20, a semiconductor package 900 may include one or more stacked memory devices 910 and a graphic processing unit (GPU) 920.

The stacked memory devices 910 and the GPU 920 may be mounted on an interposer 930, and the interposer, on which the stacked memory device 910 and the GPU 920 are mounted, may be mounted on a package substrate 940 mounted on solder balls 950. The GPU 920 may correspond to a semiconductor device that performs a memory control function. For example, the GPU 920 may be implemented as an application processor.

The stacked memory device 910 may be implemented in various forms, and the stacked memory device 910 may be a memory device in a high bandwidth memory (HBM) form, in which a plurality of layers are stacked. Accordingly, the stacked memory device 910 may include a buffer die and a plurality of memory dies, and the buffer die may include an impedance calibration circuit.

The plurality of stacked memory devices 910 may be mounted on the interposer 930. The GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. When the stacked memory device 910 includes a direct access region, a test signal may be provided into the stacked memory device 910 through conductive means (e.g., solder balls 950) mounted under package substrate 940 and the direct access region.

Embodiments may be applied to systems using semiconductor memory devices that include multi-dies. For example, embodiments may be applied to systems such as be a smart phone, a navigation system, a notebook computer, a desk top computer, and a game console that use the semiconductor memory device as a working memory.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been shown and described with reference to example embodiments thereof, it will be apparent to those of ordinary skill in the art that many modifications in form and details may be made thereto without materially departing from the spirit and scope of the disclosure as set forth by the following claims.

What is claimed is:

1. A semiconductor memory device comprising:
an external resistor provided on a board; and
a plurality of memory dies mounted on the board and commonly connected to the external resistor, one of the plurality of memory dies being designated as a master die and rest of the plurality of memory dies except the master die being designated as a plurality of slave dies, wherein:
the master die is configured to:
perform a first impedance calibration operation to determine a resistance of a first output driver and a first reference output high level (VOH) voltage of the first output driver in response to a first impedance calibration command during an initialization sequence of the semiconductor memory device; and
store, in a first register set therein, first calibration data, a first voltage and a first temperature associated with the first impedance calibration operation, and
each of the plurality of slave dies, after the first impedance calibration operation is completed, is configured to:
perform a second impedance calibration operation to determine a resistance of a second output driver and a second reference VOH voltage of the second output driver in response to the first impedance calibration command during the initialization sequence; and
store, in a second register set therein, second calibration data associated with the second impedance calibration operation and offset data corresponding to a difference between the first calibration data and the second calibration data.

2. The semiconductor memory device of claim 1, wherein each of the plurality of slave dies is configured to:
be connected to the first register set in the master die through a connection pad;
generate the offset data by referring to the first register set; and
store the offset data in the second register set.

3. The semiconductor memory device of claim 1, wherein the master die is configured to:
compare, aperiodically, the first voltage and the first temperature with a second voltage and a second temperature of the semiconductor memory device based on a detection signal associated with a change of an operating voltage and an operating temperature of the semiconductor memory device during an idle period of the semiconductor memory device;
perform a background impedance calibration operation when a first difference between the second voltage and the first voltage and a second difference between the second temperature and the first temperature exceed a reference range;
store, in the first register set, third calibration data associated with the background impedance calibration operation, the second voltage and the second temperature; and
provide the plurality of slave dies with a calibration trigger signal associated with the background impedance calibration operation.

4. The semiconductor memory device of claim 3, wherein each of the plurality of slave dies, after the background impedance calibration operation is completed, is configured to update the second calibration data stored in the second register set by a difference indicated by offset data in response to the calibration trigger signal during the idle period.

5. The semiconductor memory device of claim 3, wherein the master die further includes:
an impedance pad connected to the external resistor;
a first connection pad connected to a second connection pad of each of the plurality of slave dies; and
an impedance calibration circuit connected between the impedance pad and the first connection pad.

6. The semiconductor memory device of claim 5, wherein:
the impedance calibration circuit further includes:
a calibration controller configured to receive the first impedance calibration command from a corresponding command decoder; and
a calibration circuit connected to the external resistor through the impedance pad, the calibration circuit configured to:
perform the first impedance calibration operation in response to a calibration enable signal from the calibration controller to provide a pull-up control code and a pull-down control code to the first output driver;
store the pull-up control code and the pull-down control code in the first register set; and
provide the calibration controller with a first comparison signal and a second comparison signal indicating that the first impedance calibration operation is completed, and
the calibration controller is configured to store the first voltage and the second voltage in the first register set based on the first comparison signal and the second comparison signal.

7. The semiconductor memory device of claim 6, wherein:
the calibration controller is configured to:
compare the first voltage and the first temperature with a second voltage and a second temperature of the semiconductor memory device based on a detection signal associated with an operating voltage and an operating temperature of the semiconductor memory device during an idle period of the semiconductor memory device; and
activate the calibration enable signal when a first difference between the second voltage and the first voltage and a second difference between the second temperature and the first temperature exceed a reference range, and
the calibration circuit is configured to:
perform a background impedance calibration operation associated with the second voltage and the second temperature in response to the calibration enable signal;
store, in the first register set, third calibration data associated with the background impedance calibration operation, the second voltage and the second temperature; and
provide the plurality of slave dies with a calibration trigger signal associated with the background impedance calibration operation.

8. The semiconductor memory device of claim 7, wherein the calibration controller includes:
a timer configured to generate an interval signal that is periodically activated during the idle period;
a comparator configured to compare the first voltage and the first temperature with a second voltage and a second temperature, respectively and configured to generate a comparison signal indicating the first difference and the second difference based on a result of the comparison; and
a logic configured to activate the calibration enable signal when the first difference and the second difference exceeds the reference range based on the interval signal and the comparison signal.

9. The semiconductor memory device of claim 6, wherein the calibration circuit includes:
a first code generator configured to generate the pull-up control code obtained from a result of comparing a target VOH voltage with a first voltage at a first node between a pull-up driver and a first replica pull-down driver;
a first code storing circuit configured to store the pull-up control code when the target VOH voltage becomes substantially the same as the first voltage;
a second code generator configured to generate the pull-down control code obtained from a result of comparing the target VOH voltage with a second voltage at a second node connected to the impedance pad; and
a second code storing circuit configured to store the pull-down control code when the target VOH voltage becomes substantially the same as the second voltage.

10. The semiconductor memory device of claim 6, wherein:
the master die further includes a data output circuit configured to output a data signal by driving data based on the pull-up control code and the pull-down control code, and
the data output circuit includes the first output driver.

11. The semiconductor memory device of claim 6, wherein each of the plurality of slave dies further includes:
an impedance pad connected to the external resistor;
a second connection pad connected to a first connection pad of the master die;
a signal pad configured to receive a calibration trigger signal from the master die; and
an impedance calibration circuit connected between the impedance pad, the second connection pad and the signal pad.

12. The semiconductor memory device of claim 11, wherein:
the impedance calibration circuit further includes:
a calibration controller including a timer, the calibration controller configured to receive the first impedance calibration command from a corresponding command decoder and configured to receive the calibration trigger signal from the signal pad;
a buffer, connected to the second connection pad, the buffer configured to store the first calibration data temporarily;
a calibration circuit connected to the external resistor through the impedance pad, the calibration circuit configured to:
perform the second impedance calibration operation, in response to a calibration enable signal from the calibration controller, to generate second calibration data and provide a pull-up control code and a pull-down control code to the second output driver; and
store the pull-up control code and the pull-down control code in the second register set; and
a calculator connected to the buffer, the calculator configured to generate the offset data based on a difference between the first calibration data and the second calibration data, and
the calibration controller is configured to store the first voltage and the second voltage in the first register set based on the first comparison signal and the second comparison signal.

13. The semiconductor memory device of claim 12, wherein the timer is configured to start a counting operation from one of a time point at which the calibration controller receives the first impedance calibration command and a time point at which the calibration controller receives the calibration trigger signal and is configured to activate the calibration enable signal in a determined order.

14. The semiconductor memory device of claim 12, wherein:
the calibration controller is configured to activate the calibration enable signal in response to the calibration trigger signal associated with a change of an operating voltage and an operating temperature of the semiconductor memory device during an idle period of the semiconductor memory device, and
the calibration circuit is configured to update the second calibration data stored in the second register set by a difference indicated by offset data in response to the calibration enable signal during an idle period of the semiconductor memory device.

15. The semiconductor memory device of claim 1, wherein:
the master die is mounted on the board;
the plurality of slave dies are stacked on the master die; and
the master die is connected to respective one of the plurality of slave dies through respective one of a plurality of wires.

16. The semiconductor memory device of claim 1, further comprising:
a voltage/temperature sensor configured to:
sense an operating voltage and an operating temperature of the semiconductor memory device;
provide the master die with a detection signal that is activated when a change of the operating voltage and the operating temperature exceeds a reference range; and
provide the operating voltage and the operating temperature to the master die, and
the master die and the plurality of slave dies are configured to perform a background impedance calibration operation aperiodically in response to a calibration trigger signal based on the detection signal in an idle mode.

17. A memory system comprising:
a semiconductor memory device including a plurality of memory dies; and
a memory controller configured to control the semiconductor memory device, wherein:
the semiconductor memory device includes:
an external resistor provided on a board; and
the plurality of memory dies mounted on the board and commonly connected to the external resistor, one of the plurality of memory dies being designated as a master die and rest of the plurality of memory dies except the master die being designated as a plurality of slave dies,
the master die is configured to:
perform a first impedance calibration operation to determine a resistance of a first output driver and a first reference output high level (VOH) voltage of the first output driver in response to an impedance calibration command during an initialization sequence of the semiconductor memory device; and
store, in a first register set therein, first calibration data, a first voltage and a first temperature associated with the first impedance calibration operation, and
each of the plurality of slave dies, after the first impedance calibration operation is completed, is configured to:
perform a second impedance calibration operation to determine a resistance of a second output driver and a second reference VOH voltage of the second output driver in response to the impedance calibration command during the initialization sequence; and
store, in a second register set therein, second calibration data associated with the second impedance calibration operation and offset data corresponding to a difference between the first calibration data and the second calibration data.

18. A semiconductor memory device comprising:
a first memory die configured to:
perform a first impedance calibration operation, with respect to an external resistance, to acquire first calibration data, and
determine a first resistance of a first output driver based on the first calibration data; and
a second memory die configured to:
perform a second impedance calibration operation, with respect to the external resistance, to acquire second calibration data, and
determine a second resistance of a second output driver based on a difference between the second calibration data and the first calibration data.

19. The semiconductor memory device of claim 18, wherein the second output driver determines the second resistance in response to a command received from the first output driver.

20. The semiconductor memory device of claim 18, wherein before the second output driver determines the second resistance based on the difference between the second calibration data and the first calibration data, the second output driver determines the second resistance based on the second calibration data alone, and
wherein the second output driver determines the second resistance based on both the second calibration data and the difference between the second calibration data and the first calibration data.

\* \* \* \* \*